US010497451B2

(12) United States Patent
Jang et al.

(10) Patent No.: US 10,497,451 B2
(45) Date of Patent: Dec. 3, 2019

(54) DATA TRANSFER TRAINING METHOD AND DATA STORAGE DEVICE PERFORMING THE SAME

(71) Applicant: SK hynix Inc., Gyeonggi-do (KR)

(72) Inventors: Se Hwa Jang, Gyeonggi-do (KR); Kang Woo Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 65 days.

(21) Appl. No.: 15/785,617

(22) Filed: Oct. 17, 2017

(65) Prior Publication Data
US 2018/0267724 A1   Sep. 20, 2018

(30) Foreign Application Priority Data

Mar. 14, 2017 (KR) .................. 10-2017-0031623

(51) Int. Cl.
*G11C 16/32* (2006.01)
*G06F 13/16* (2006.01)
*G06F 11/00* (2006.01)
*G11C 7/22* (2006.01)
*G11C 16/10* (2006.01)
*G11C 16/26* (2006.01)

(52) U.S. Cl.
CPC .............. *G11C 16/32* (2013.01); *G06F 11/00* (2013.01); *G06F 13/16* (2013.01); *G11C 7/22* (2013.01); *G11C 16/10* (2013.01); *G11C 16/26* (2013.01)

(58) Field of Classification Search
None
See application file for complete search history.

(56) References Cited

U.S. PATENT DOCUMENTS

| 9,811,273 B1* | 11/2017 | Brahmadathan ...... G06F 3/0619 |
| 2010/0185803 A1* | 7/2010 | Gjoerup ................ G06F 13/385 |
| | | 711/103 |
| 2011/0066900 A1* | 3/2011 | Tokiwa ............... G11C 13/0007 |
| | | 714/704 |
| 2012/0087194 A1* | 4/2012 | Oh ........................ G11C 7/1087 |
| | | 365/189.16 |
| 2012/0221880 A1* | 8/2012 | Kim ...................... G06F 1/3225 |
| | | 713/400 |

(Continued)

FOREIGN PATENT DOCUMENTS

KR      100903367      6/2009

*Primary Examiner* — Charles Rones
*Assistant Examiner* — Jonah C Krieger
(74) *Attorney, Agent, or Firm* — IP & T Group LLP

(57) ABSTRACT

A data transfer training method includes determining whether a program data transfer training command or a read data transfer training command is received from a host device; transferring normal program signals to non-training memory devices among a plurality of memory devices and performing a program data transfer training to a training memory device among a plurality of memory devices while performing normal program operations to the non-training memory devices in response to a received program data transfer training command; and transferring normal read signals to the non-training memory devices, and performing a read data transfer training to the training memory device while performing normal read operations to the non-training memory devices in response to a received read data transfer training command.

20 Claims, 16 Drawing Sheets

(56) References Cited

U.S. PATENT DOCUMENTS

2015/0067201 A1\* 3/2015 Song ................. G06F 13/4022
                                                710/51
2016/0141013 A1\* 5/2016 Lin .................... G06F 13/1689
                                                365/193
2017/0031626 A1\* 2/2017 Kim ................... G06F 3/0656

\* cited by examiner

DTTR

|  | Start | Interval | End |
|---|---|---|---|
| TS1 | $t_{srt1}$ | $t_{itv1}$ | $t_{end1}$ |
| TS2 | $t_{srt2}$ | $t_{itv2}$ | $t_{end2}$ |
| ⋮ | ⋮ | ⋮ | ⋮ |
| TSi-1 | $t_{srti-1}$ | $t_{itvi-1}$ | $t_{endi-1}$ |
| TSi | $t_{srti}$ | $t_{itvi}$ | $t_{endi}$ | ure # DATA TRANSFER TRAINING METHOD AND DATA STORAGE DEVICE PERFORMING THE SAME

CROSS-REFERENCES TO RELATED APPLICATION

The present application claims priority under 35 U.S.C. § 119(a) to Korean application number 10-2017-0031623 filed on Mar. 14, 2017, in the Korean Intellectual Property Office, which is incorporated herein by reference in its entirety.

BACKGROUND

1. Technical Field

Various embodiments of the present invention relate generally to a semiconductor device and, more particularly, to a data transfer training method and a data storage device performing the same.

2. Related Art

Recently, the paradigm for the computer environment has been converted into ubiquitous computing so that computer systems can be used anytime and anywhere. Due to this fact, the use of portable electronic devices such as mobile phones digital cameras, and notebook computers has rapidly increased. In general, such portable electronic devices use a data storage device which uses a memory device for storing data to be used in the portable electronic devices.

A data storage device using a memory device provides advantages in that, since there is no mechanical driving part, stability and durability are excellent an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments of the present invention are directed to a data transfer training method for preventing a data transfer fail between a controller and a memory device, and a data storage device capable for performing the same.

In an embodiment, a data transfer training method of a data storage device including a plurality of memory devices and controller may include: determining whether a program data transfer training command or a read data transfer training command is received from a host device; transferring normal program signals to non-training memory devices among the plurality of memory devices and performing a program data transfer training to a training memory device among the plurality of memory devices while performing normal program operations to the non-training memory devices in response to a received program data transfer training command; and transferring normal read signals to the non-training memory devices, and performing a read data transfer training to the training memory device while performing normal read operations to the non-training memory devices in response to a received read data transfer training command.

In an embodiment, a data storage device may include: a memory device including a plurality of nonvolatile memory devices; and a controller suitable for performing normal program operations for non-training memory devices among the plurality of nonvolatile memory devices and performing program data transfer training for a training memory device while the normal program operations are performed in the non-training memory devices, when a program data transfer training command is received from a host device. The controller may include a random access memory including a data transfer timing register; a memory control unit suitable for generating normal program signals to be provided to the non-training memory devices and a buffer program signal for performing the program data transfer training for the training memory device, and providing generated signals to, the memory device; and a processor suitable for controlling the memory control unit to perform program data transfer training for the nonvolatile memory devices in response to the program data transfer training command from the host device.

The data transfer timing register includes a plurality of timing sets, and each timing set includes a transfer start timing indicating a data transfer start, a transfer end timing indicating a data transfer end, and one or more transfer timings existing with a predetermined interval between the transfer start timing and the transfer end timing.

The memory control unit first transfers the normal program signals to the non-training memory devices, transfers the buffer program signal and program data to a page buffer of the training memory device based on a timing set selected among the plurality of timing sets while the normal program operations are performed in the non-training memory devices, reads the program data from the page buffer of the training memory device, and matches and stores read program data and a timing transferred to the page buffer.

The processor counts the number of fail bits in each of read program data by comparing each of the read program data for respective transfer timings with predetermined reference data when the program data transfer training for the training memory device is completed and matches and stores a program data transfer window including all program data transfer timings respectively corresponding to program data of each of which the number of fail bits is equal to or smaller than a predetermined threshold value, among the read program data, and a corresponding training memory device.

The processor extracts an overlapping period of program data transfer windows for the respective nonvolatile memory devices when the program data transfer training for the plurality of nonvolatile memory devices is completed, and sets an extracted overlapping period as a common program data transfer window for the plurality of nonvolatile memory devices.

Each of the nonvolatile memory devices provides a state information indicating generation of a peak current to the controller in response to a request of the controller, and the controller starts performing the program data transfer training for the training memory device when the state information is received from at least one nonvolatile memory device among the plurality of nonvolatile memory devices.

In an embodiment, a data storage device may include: a memory device including a plurality of nonvolatile memory devices; and a controller suitable for performing normal read operations for non-training memory devices among the plurality of nonvolatile memory devices and performing read data transfer training for a training memory device while the normal read operations are performed in the non-training memory devices, when a read data transfer training command is received from a host device. The controller may include a random access memory including a data transfer timing register; a memory control unit suitable for generating normal read signals to be provided to the non-training memory devices and a buffer read signal for performing the read data transfer training for the training memory device, and providing generated signals to the memory device; and a processor suitable for controlling the memory control unit to perform read data transfer training for the nonvolatile memory devices in response to the read data transfer training command from the host device.

The data transfer timing register includes a plurality of timing sets, and each timing set includes a transfer start timing indicating a data transfer start, a transfer end timing indicating a data transfer end, and one or more transfer timings existing with a predetermined interval between the transfer start timing and the transfer end timing.

The memory control unit transfers normal program signals and a buffer program signal to the non-training memory devices and the training memory device, respectively, first transfers the normal read signals to the non-training memory devices such that the normal read operations are performed in the non-training memory devices, fetches data read from the training memory device based on the buffer read signal and a timing set selected among the plurality of timing sets while the normal read operations are performed in the non-training memory devices, and matches and stores the fetched data and the fetch timing.

The processor counts the number of fail bits in each of read data by comparing each of the read data for respective transfer timings with predetermined reference data when the read data transfer training for the training memory device is completed, and matches and stores a read data transfer window including all read data transfer timings respectively corresponding to read data of each of which the number of fail bits is equal to or smaller than a predetermined threshold value, among the read data, and a corresponding training memory device.

The processor extracts an overlapping period of read data transfer windows for the respective nonvolatile memory devices when the read data transfer training for the plurality of nonvolatile memory devices is completed, and sets an extracted overlapping period as a common read data transfer window for the plurality of nonvolatile memory devices.

In an embodiment, a data storage device may include: a plurality of memory devices; and a controller configured to perform a program data transfer training to a training memory device among the memory devices while performing normal program operations to non-training memory devices among the memory devices in response to a program data transfer training command provided from a host device and perform a read data transfer training to the training memory device among the memory devices while performing normal read operations to the non-training memory devices in response to a read data transfer training command provided from the host device.

According to the embodiments, it is possible to set a common data transfer window for ensuring the validity of data for all memory devices included in a data storage device.

As a consequence, it is possible to prevent data transfer fail between a controller and each memory device.

DETAILED DESCRIPTION

Hereinafter, a data transfer training method and a data storage device performing the same will be described below with reference to the accompanying drawings through various exemplary embodiments.

Figure 1:
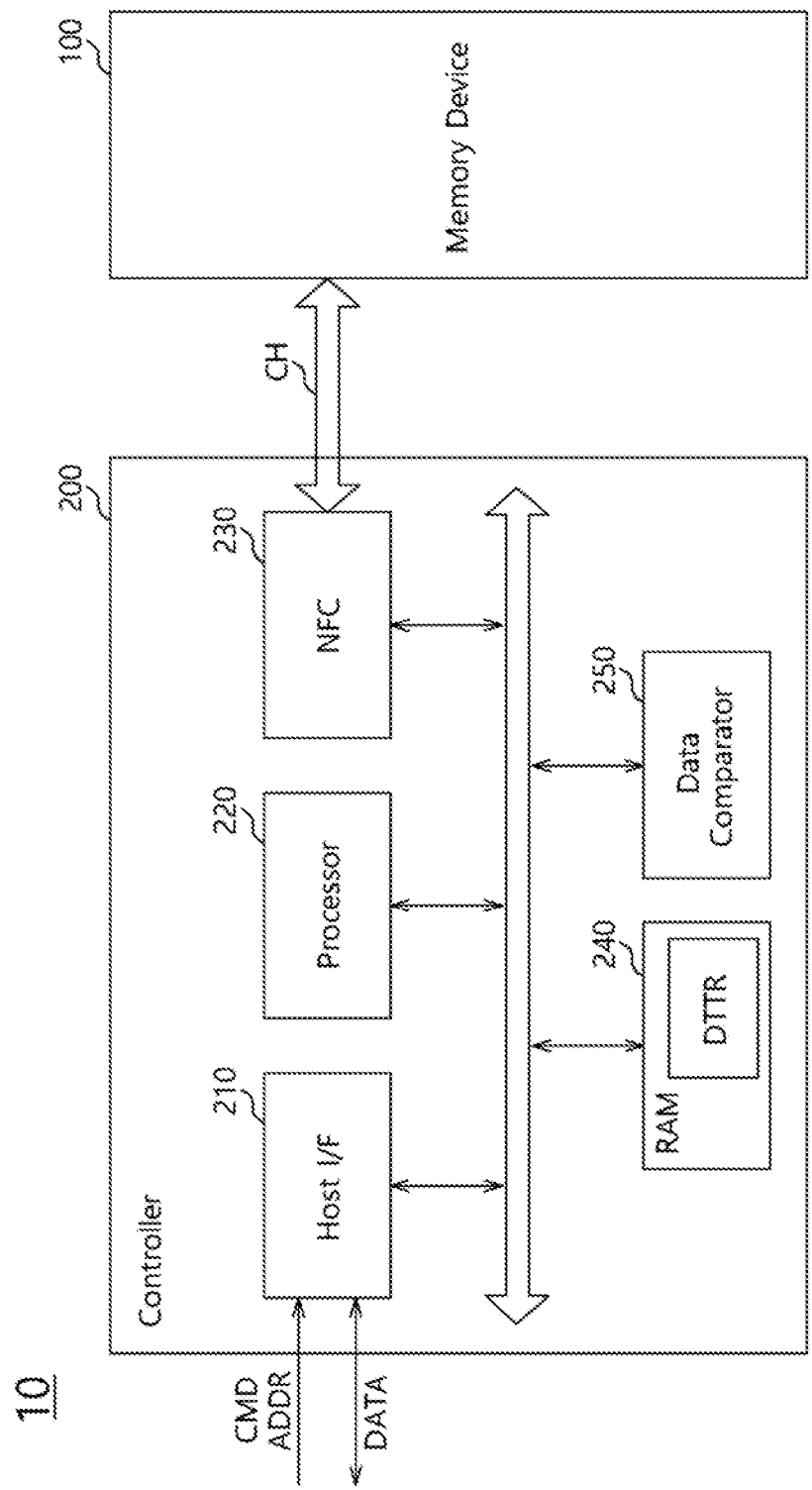
FIG. 1 is a block diagram schematically illustrating an exemplary configuration of a data storage device in accordance with an embodiment.

FIG. 1 is a block diagram schematically illustrating an exemplary configuration of a data storage device 10 in accordance with an embodiment.

The data storage device 10 may store data to be accessed by a host device (not shown) such as a mobile phone, an MP3 player, a laptop computer, a desktop computer, a game player, a TV, an in-vehicle infotainment system, and so forth. The data storage device 10 may also be referred as a memory system.

The data storage device 10 may be manufactured as any one of various kinds of storage devices according to the protocol of an interface which is electrically coupled with the host device. For example, the data storage device 10 may be configured as any one of various kinds of storage devices such as a solid state drive, a multimedia card (MMC) in the form of an embedded MMC (eMMC), a reduced size MMC (RS-MMC) and a micro-MMC, a secure digital (SD) card in the form of a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 10 may be manufactured as any one among various kinds of package types. For example, the data storage device 10 may be manufactured as any one of various kinds of package types such as a package-on-package (POP), a system-in-package (SIP), a system-on-chip (SOC), a multi-chip package (MCP), a chip-on-board (COB), a wafer-level fabricated package (WP) and a wafer-level stack package (WSP).

Referring to FIG. 1, the data storage device 10 may include a memory device 100 and a controller 200 operatively coupled via a communication channel CH.

The controller 200 may control the general operations of the data storage device 10. The controller 200 may decode and drive a code type instruction or algorithm such as a firmware or a software. The controller 200 may be embodied in the form of a hardware or in the combined form of a hardware and a software.

The controller 200 may receive signals such as a command CMD and an address ADDR from an external device, for example, the host device, and control the memory device 100 in response to the received signals. For example, the controller 200 may read out data DATA stored in the memory device 100 and provide the read-out data DATA to the host device or store data DATA received from the host device in the memory device 100, in response to the signals received from the host device.

The controller 200 may include a host interface 210, a processor 220, a memory control unit (NFC) 230, a random access memory 240 and a data comparator 250. While not shown in FIG. 1, the controller 200 may further include an error correction code (ECC) unit. The ECC unit may generate parity data for data DATA received from the host device, and may detect and correct an error of data DATA read out from the memory device 100 by using the parity data.

The host interface 210 may interface the host device and the controller 200 according to the protocol of the host device. For example, the host interface 210 may include at least one among various interfaces such as double data rate (DDR), DDR2, DDR3, DDR4, low power DDR (LPDDR), universal serial bus (USB), universal flash, storage (UFS), multimedia card (MMC), embedded MMC, advanced technology attachment (ATA), parallel advanced technology attachment (PATA), serial advanced technology attachment (SATA), small computer system interface (SCSI), enhanced small disk interface (ESDI), integrated drive electronics (IDE), serial attached SCSI (SAS), peripheral component interconnection (PCI) and PCI express (PCI-E), firewire and nonvolatile memory express (NVMe).

The host interface 210 may receive a data transfer training command CMD_DTT (see FIG. 7) provided from the host device. The data transfer training command CMD_DTT may include an information on whether the corresponding command is a program data transfer training command or a read data transfer training command, an information on data transfer timings and so forth, but is not specifically limited thereto.

The program data transfer training command means training between the controller 200 and the memory device 100 to transfer program data to be stored in the memory device 100. The read data transfer training command means training between the controller 200 and the memory device 100 to fetch read data from the memory device 100 and to provide them to the controller 200.

The processor 220 may control the general operations of the controller 200. The processor 220 may drive the code type instruction or algorithm, that is, a software, loaded in the random access memory 240, and control the operations of internal function blocks. The processor 220 may include function blocks (not shown) for driving the software. The processor 220 may be configured by a micro control unit (MCU) or a central processing unit (CPU).

The processor 220 may determine whether the data transfer training command CMD_DTT for performing a data transfer training operation is received from the host device. If the data transfer training command CMD_DTT is received from the host device, the processor 220 may determine whether the data transfer training command CMD_DTT is a program data transfer training command or a read data transfer training command.

If the data transfer training command CMD_DTT is a program data transfer training command, the processor 220 may control the memory control unit 230 to perform program data transfer training with the memory device 100. If the data transfer training command CMD_DTT is a read data transfer training command, the processor 220 may control the memory control unit 230 to perform read data transfer training with the memory device 100.

The memory control unit 230 may control the memory device 100 according to the control of the processor 220. For example, the memory control unit 230 may generate control signals corresponding to a request received from the host device and provide the generated control signals to the memory device 100, according to the control of the processor 220. The control signals may include a command, an address and so forth for controlling the memory device 100.

For example, the memory control unit 230 may generate a control signal corresponding to a program request of the host device and a logical address to be programmed, and may provide the generated control signal and program data transferred from the host device together to the memory device 100. Also, the memory control unit 230 may generate a control signal corresponding to a read request of the host device and a logical address, may provide the generated control signal to the memory device 100, and may be provided with read data read out from a physical address of the memory device 100 corresponding to the logical address.

In the present embodiment, the memory control unit 230 may perform data transfer training, for example, program data transfer training or read data transfer training, with the memory device 100 under the control of the processor 220.

Figure 20:
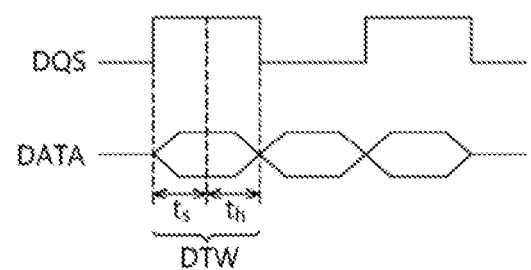
FIG. 20 is an exemplary diagram to assist in the explanation of a data transfer window.

In general, when data DATA is transferred from the memory control unit 230 of the controller 200 to the memory device 100 or data DATA is transferred from the memory device 100 to the memory control unit 230 of the controller 200, in order to ensure the validity of the data DATA to be transferred, as shown in FIG. 20, the level of the data DATA should be kept constant for a setup time $t_s$ and a hold time $t_h$. In this regard, the period from a starting time point of the setup time $t_s$ to an ending time point of the hold time $t_h$ is referred to as a data transfer window DTW. That is to say, in order to prevent a transfer fail from occurring in data DATA, data DATA which are to be transferred to the memory control unit 230 or which are to be transferred to the memory device 100 should retain a constant level during the data transfer window DTW.

In general, the controller 200 applies one data transfer window DTW for each of nonvolatile memory devices NVM (see FIG. 3) included in the memory device 100. Due to this fact, it is important to set an optimal common data transfer window CDTW for ensuring the validity of data DATA for all the nonvolatile memory devices NVM.

The common data transfer window CDTW may be set to have a period in which a plurality of data transfer windows DTW overlap, by using the plurality of data transfer windows DTW for the nonvolatile memory devices NVM through a plurality of data transfer trainings respectively for the plurality of nonvolatile memory devices NVM.

In the present embodiment, by performing data transfer training in a situation similar to an actual situation in which the data storage device 10 is used by a user, it is possible to obtain a data transfer window DTW substantially applicable for all of the nonvolatile memory devices NVM.

To this end, there is suggested a scheme for finding an optimal data transfer window DTW by performing program data transfer training or read data transfer training to one nonvolatile memory device NVM (hereinafter referred to as a 'training memory device') to be trained among the plurality of nonvolatile memory devices NVM in a worst situation where normal program operations or normal read operations are performed to the remaining nonvolatile memory devices NVM (hereinafter, referred to as 'non-training memory devices') except the training memory device.

In operation, when the host device provides a program data transfer training request signal to the controller 200, the memory control unit 230 may generate training control signals for the program data transfer training and perform the program data transfer training with the memory device 100 by using the generated control signals.

The control signals for the program data transfer training may include normal program signals to be transferred to non-training memory devices among the plurality of nonvolatile memory devices NVM included in the memory device 100, a buffer program signal to be transferred to a training memory device and a buffer read signal to be transferred to the training memory device.

A normal program signal means a program signal for storing data in a memory cell. Accordingly, a normal program signal may include a normal program command, an address information (a row address and a column address) for a memory cell, and program data to be written to the memory cell.

A buffer program signal means a program signal for storing data in a page buffer. Accordingly, a buffer program signal may include a buffer program command, an address information (a column address, a plane address and so forth) of a page buffer (hereinafter, referred to as a 'buffer address'), and program data.

A buffer read signal means a read signal for reading out stored data from a page buffers. Accordingly, a buffer read signal may include a buffer read command, and a buffer address.

In order to perform program data transfer training for a training memory device while normal program operations are performed in non-training memory devices, the memory control unit 230 may first transfer normal program signals to the non-training memory devices and then transfer a buffer program signal to the training memory device.

For example, when transferring the buffer program signal to the training memory device, the memory control unit 230 may provide program data to the training memory device in conformity with respective timings included in one timing set TS, which is selected among a plurality of timing sets TS defined in a data transfer timing register DTTR stored in the random access memory 240, after transferring a buffer program command and a buffer address to the training memory device. The memory control unit 230 may select a corresponding one timing set TS in the data transfer timing register DTTR based on a data transfer timing information received from the host device. The program data provided to the training memory device may be stored in the page buffer of the corresponding training memory device.

The memory control unit 230 may transfer a buffer read signal to the training memory device, and the training memory device may provide the program data stored in the page buffer to the memory control unit 230 in response to the received buffer read signal. The memory control unit 230 may store the program data provided from the training memory device in the random access memory 240 by matching it with a corresponding timing information.

A series of operations, in which normal program signals are transferred to non-training memory devices, a buffer program signal is transferred to a training memory device, program data is read from the training memory device and the read program data is stored by being matched with a corresponding timing information, may be performed repeatedly for respective timings included in a selected timing set TS, but are not specifically limited thereto.

For example, it is assumed that a timing set TS includes a first transfer timing and a second transfer timing.

In this case, the memory control unit 230 may first transfer normal program signals to non-training memory devices, transfer a buffer program command and a buffer address to a training memory device, transfer program data to the training memory device at the first transfer timing, read program data from the training memory device, and store the read program data by matching it with the first transfer timing.

Thereafter, the memory control unit 230 may first transfer normal program signals to the non-training memory devices, transfer a buffer program command and a buffer address to the training memory device, transfer program data to the training memory device at the second transfer timing, read program data from the training memory device, and store the read program data by matching it with the second transfer timing.

Meanwhile, if a read data transfer training request signal is provided from the host device, the memory control unit 230 may generate training control signals for the read data transfer training and perform read data transfer training with the memory device 100 by using the generated control signals.

Control signals for the read data transfer training may include normal program signals and normal read signals to be transferred to non-training memory devices and a buffer program signal and a buffer read signal to be transferred to a training memory device.

A normal read signal means a read signal for reading out data from a memory cell. Accordingly, a normal read signal may include a normal read command, an address of a memory cell and so forth. Since descriptions were made above for a normal program signal, a buffer program signal (i.e., a buffer program command, a buffer address of a page buffer, and program data) and a buffer read signal (i.e., a buffer read command and a buffer address) detailed descriptions therefor will be omitted herein.

The memory control unit 230 may transfer a buffer program signal and normal program signals to a training memory device and non-training memory devices, respectively, and thereby, may store data (that is, data for performing read data transfer training) in the page buffer of the training memory device and the memory cells of the non-training memory devices.

Thereafter, the memory control unit 230 may transfer normal read signals to the non-training memory devices such that normal read operations are performed to the non-training memory devices, respectively, and transfer a buffer read signal to the training memory device. The training memory device may provide the data stored in the page buffer to the memory control unit 230 in response to the received buffer read signal. The memory control unit 230 may fetch the data read from the training memory device in conformity with each of the timings included in one timing set TS, which is selected among the plurality of timing sets TS of the data transfer timing register DTTR. The memory control unit 230 may select a corresponding one timing set TS in the data transfer timing register DTTR based on a data transfer timing information received from the host device.

The memory control unit 230 may store the read data which are fetched at respective timings, in the random access memory 240, by matching them with respectively corresponding timing information.

Data read from the training memory device may be fetched repeatedly according to the number of timings included in the selected timing set TS while one normal read operation is performed to the respective non-training memory devices, but are not specifically limited thereto.

In other words, while a plurality of normal program operations may be performed to the non-training memory devices by the number of timings included in a timing set TS when performing program data transfer training, one normal read operations may be performed to the non-training memory devices when performing read data transfer training.

The random access memory 240 may store a firmware or a software to be driven by the processor 220. Further, the random access memory 240 may be configured to store data necessary for driving the firmware or the software. Namely, the random access memory 240 may operate as a working memory of the processor 220.

The random access memory 240 may be configured to temporarily store data program data to be transferred from the host device to the memory device 100, or read data to be transferred from the memory device 100 to the host device. In other words, the random access memory 240 may operate as a buffer memory.

The random access memory 240 may include the data transfer timing register DTTR. The data transfer timing register DTTR may store a plurality of timings at each of which program data is provided from the controller 200 to the memory device 100 during the program data transfer training between the controller 200 and the memory device 100 or a plurality of timings at each of which the controller 200 fetches the data read from the memory device 100 during the read data transfer training between the controller 200 and the memory device 100.

Figures 2, 3:
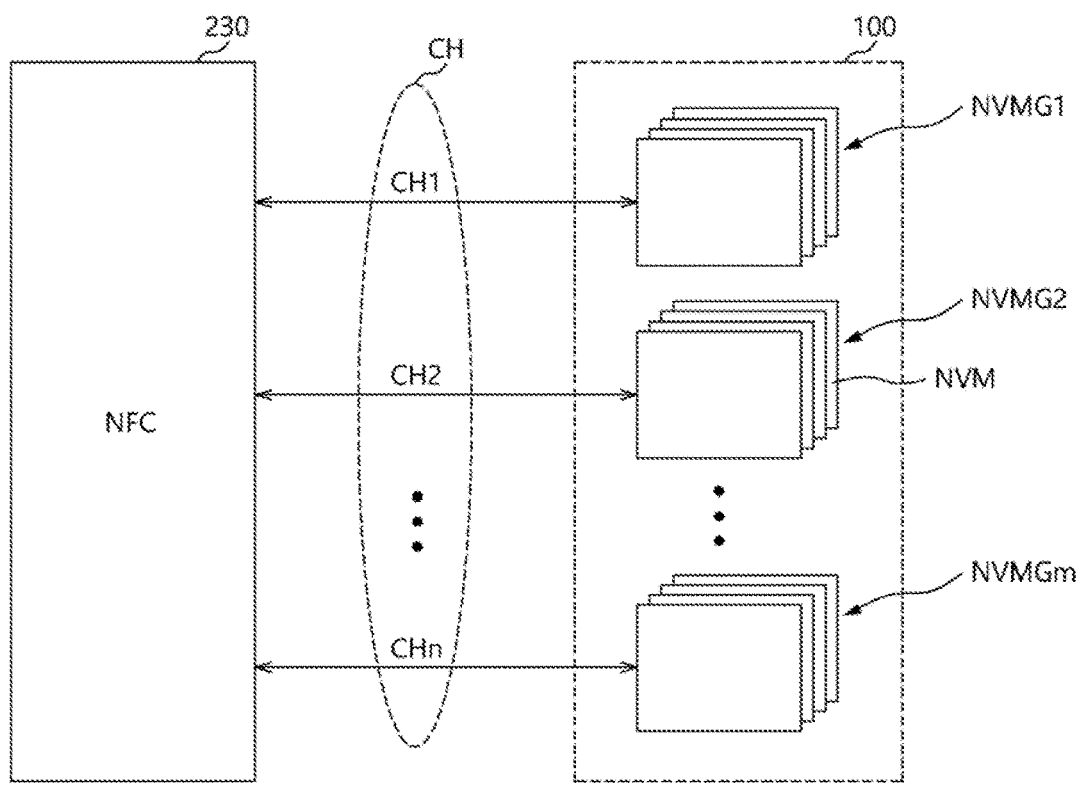
FIG. 2 is a diagram illustrating a representation of an example of a data transfer timing register.
FIG. 3 is a block diagram schematically illustrating an exemplary configuration of the memory device shown in FIG. 1.

FIG. 2 is a diagram illustrating a representation of an example of the data transfer timing register DTTR.

Referring to FIG. 2, the data transfer timing register DTTR may include a plurality of timing sets TS1 to TSi. Each timing set TS may include a transfer start timing $t_{srt}$, a transfer interval $t_{itv}$, and a transfer end timing $t_{end}$. For example, the transfer start timing $t_{srt}$ means a timing at which providing (fetching) of the data is started.

The transfer end timing $t_{end}$ means a timing at which the providing (fetching) of data is ended. The transfer interval $t_{itv}$ means an interval between a plurality of timings of the providing (fetching) of a plurality of data from the transfer start timing $t_{srt}$ to the transfer end timing $t_{end}$.

The transfer start timing $t_{srt}$ may be set based on a point of time at which a data strobe signal DQS (see FIG. 20) transitions from a logic low to a logic high. For example, the transfer start timing $t_{srt}$ may be set as a point of time that is delayed by a predetermined time from a point of time at which the data strobe signal DQS obtains logic high, but is not specifically limited thereto.

In the program or read data transfer training, the number of times of the providing (or fetching) of data from the transfer start timing $t_{srt}$ to the transfer end timing $t_{end}$ may be adjusted by the transfer interval $t_{itv}$. For example, the number of times of the providing (or fetching) of data from the transfer start timing $t_{srt}$ to the transfer end timing $t_{end}$ may increase as the transfer interval $t_{itv}$ becomes shorter, and may decrease as the transfer interval $t_{itv}$ becomes longer.

The respective timing sets TS included in the data transfer timing register DTTR may include transfer start timings $t_{srt}$, transfer intervals $t_{itv}$ and transfer end timings $t_{end}$ that are the same with or different from one another.

Referring back to FIG. 1 during the program or read data transfer training, the data comparator 250 may compare each of the read program data (or the fetched read data) which are stored in the random access memory 240 and reference data, and count the number of fail bits in each of the read program data (or the fetched data). The technology of comparing test target data and reference data and counting the number of fail bits in the test target data based on the comparison is well known in the art, hence, detailed descriptions thereof are omitted herein.

The processor 220 may compare the number of fail bits in each of the read program data (or the fetched data) that is counted by the data comparator 250, with a predetermined threshold value.

The processor 220 may store a program data transfer window (or a read data transfer window) including all the program data transfer timings (or the read data transfer timings) respectively corresponding to read program data (or the fetched data) in each of which the number of fail bits is equal to or smaller than the predetermined threshold value, in the random access memory 240, by matching it with an information (for example, an identification information) on a corresponding training memory device.

Also, each time program data transfer training (or read data transfer training) for each of all the nonvolatile memory devices NVM included in the memory device 100 is completed, the processor 220 may match an information on each nonvolatile memory device and a corresponding program data transfer window (or a read data transfer window) and may store them in the random access memory 240.

Moreover, if program data transfer training (or read data transfer training) for all the nonvolatile memory devices NVM of the memory device 100 is completed, the processor 220 may set a period in which program data transfer windows (or read data transfer windows) for the respective nonvolatile memory devices NVM stored in the random access memory 240 overlap, as a common program data transfer window (or a common read data transfer window) for the memory device 100.

The common program data transfer window and the common read data transfer window set in this way may be stored in a system data region (not shown) of at least one nonvolatile memory device NVM included in the memory device 100, and thereafter, may be applied in an actual operation of the data storage device 10.

Figure 21:
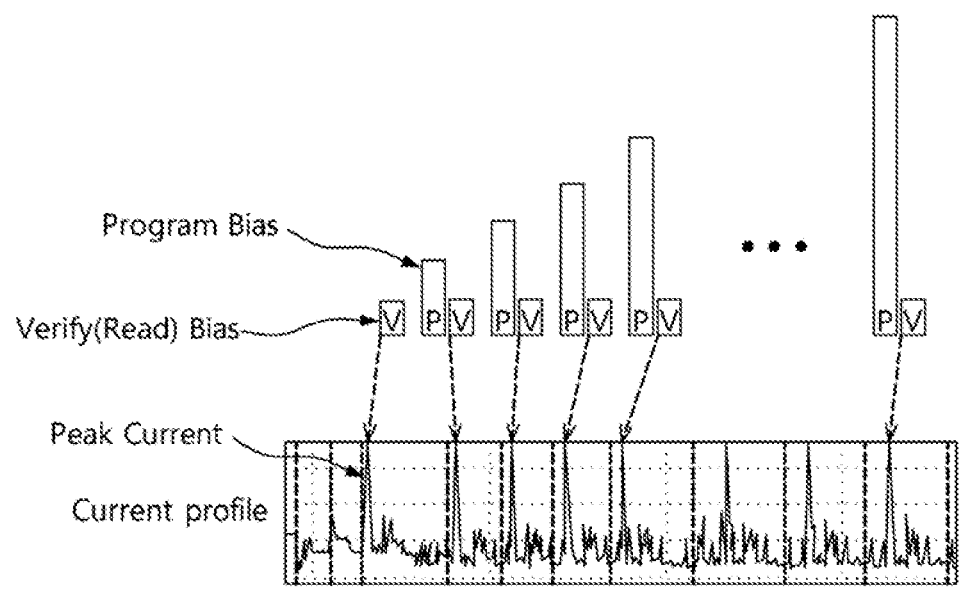
FIG. 21 is an exemplary diagram to assist in the explanation of peak current generation time points.

The processor 220 may control the memory control unit 230 to request to each of non-training memory devices a state information which indicates whether a peak current is generated or not. In general, in the nonvolatile memory devices NVM, as shown in FIG. 21, peak currents may be generated at a point of time at which a verify bias is applied during a program operation and a point of time at which a read bias is applied during a read operation. Since the generation of a peak current means an increase in the power consumption of the data storage device 10, in this case, there is a high possibility that transfer of data DATA between the controller 200 and some nonvolatile memory devices NVM of the memory device 100 fails.

In the present embodiment, in order to perform data transfer training in a worse situation, a state information on whether a peak current is generated or not is requested to each of non-training memory devices, and when an information on the generation of a peak current is received, the operation of providing program data to a training memory device or the operation of fetching data read from a training memory device may be started to be performed.

To this end, each of the nonvolatile memory devices NVM may include a state register (not shown) for storing a state information indicating whether a peak current is generated or not, and may provide a corresponding state information each time a signal requesting a state information on whether a peak current is generated or not is received from the memory control unit 230.

The memory device 100 may operate as the storage medium of the data storage device 10. The memory device 100 may communicate with the controller 200, for example, the memory control unit 230, through a channel CH.

FIG. 3 is a block diagram schematically illustrating an exemplary configuration of the memory device 100 shown in FIG. 1.

Referring to FIG. 3, the memory device 100 may include a plurality of nonvolatile memory devices NVM. A plurality of channels CH which couple the memory device 100 and the memory control unit 230 may be provided. A plurality of memory groups NVMG1 to NVMGm each including a plurality of nonvolatile memory devices NVM may be coupled to a plurality of channels CH1 to CHn, respectively.

For example, a first memory group NVMG1 may communicate with the memory control unit 230 through a first channel CH1. The plurality of nonvolatile memory devices NVM included in the first memory group NVMG1 may operate by a plurality of chip activation signals, respectively, received through the first channel CH1.

Each of the plurality of nonvolatile memory devices NVM may be configured by any one of various types of nonvolatile memory devices such as a NAND flash memory device, a NOR flash, memory device, a ferroelectric random access memory (FRAM) using ferroelectric capacitors, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

Figure 4:
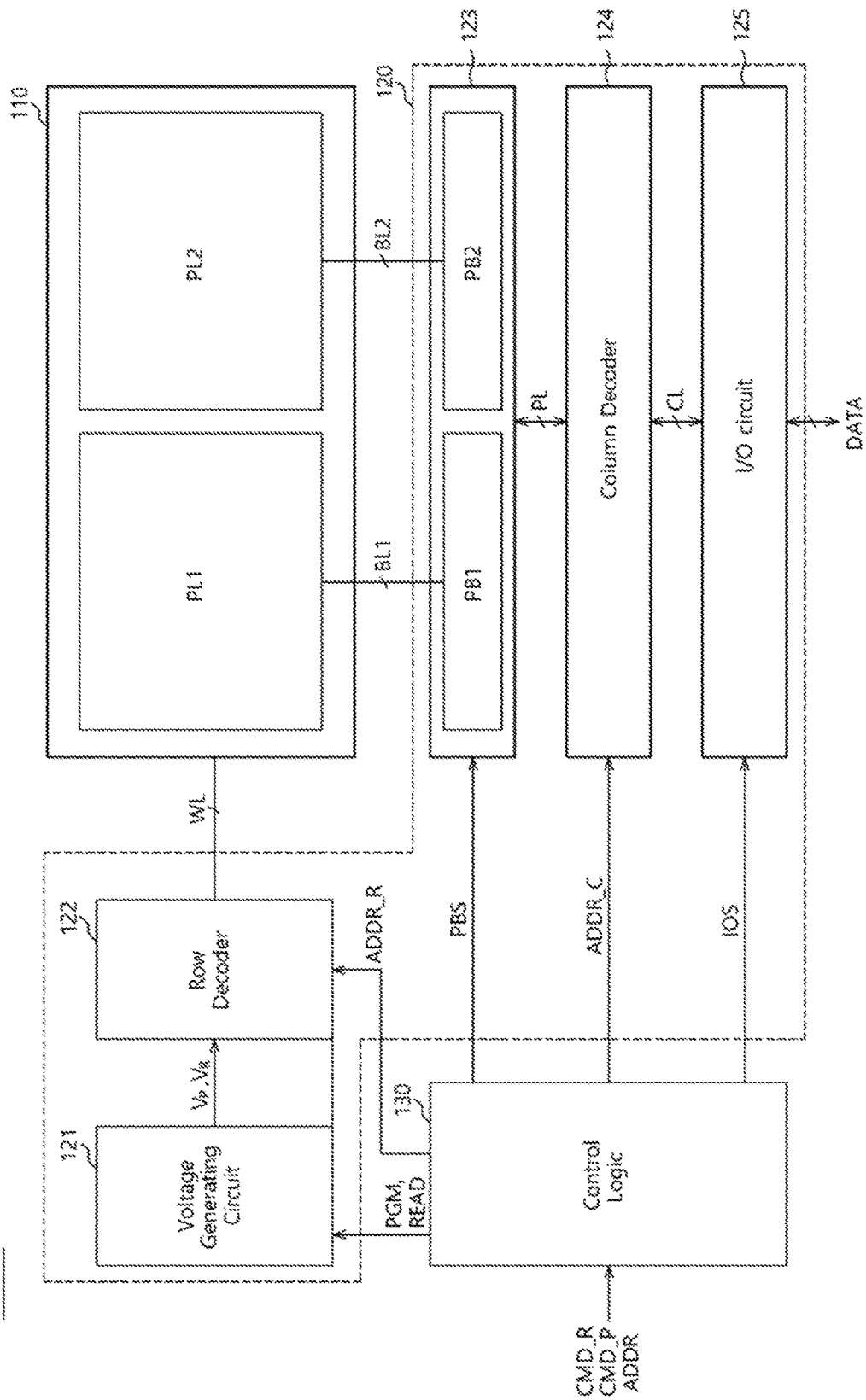
FIG. 4 is a block diagram schematically illustrating an exemplary configuration of a nonvolatile memory device included in the memory device shown in FIG. 3.

FIG. 4 is a block diagram schematically illustrating an exemplary configuration of a nonvolatile memory device included in the memory device of FIG. 3.

Referring to FIG. 4, a nonvolatile memory device NVM may include a memory cell array 110, a peripheral circuit 120 and a control logic 130.

The memory cell array 110 may include a plurality of planes. For example, the memory cell array 110 may include a first plane PL1 and a second plane PL2 but is not, specifically limited thereto. Each of the first and second planes PL1 and PL2 may include a plurality of memory blocks (not shown). Each of the plurality of memory blocks may include a plurality of memory cells (not shown).

The plurality of memory blocks included in the first plane PL1 may share a plurality of first bit lines BL1. The plurality of memory blocks included in the second plane PL2 may share a plurality of second bit lines BL2 other than the first bit lines BL1.

The peripheral circuit 120 may include a voltage generating circuit 121 a row decoder 122, a page buffer block 123, a column decoder 124 and an input/output circuit 125.

The voltage generating circuit 121 may generate a program voltage $V_P$ or a read voltage $V_R$ in response to a program signal PGM or a read signal READ. Besides the program voltage $V_P$ or the read voltage $V_R$, the voltage generating circuit 121 may generate various voltages necessary for various operations.

The row decoder 122 may transfer voltages outputted from the voltage generating circuit 121, to a selected memory block in response to a row address ADDR_R. For example, the row decoder 122 may transfer the program voltage $V_P$ or the read voltage $V_R$ to word lines WL coupled to the selected memory block.

The page buffer block 123 may include a plurality of page buffers PB. For example, the page buffer block 123 may include a first page buffer PB1 which is coupled to the first plane PL1 of the memory cell array 110 and a second page buffer PB2 which is coupled to the second plane PL2 of the memory cell array 110. The first page buffer PB may be coupled to first bit lines BL1 which are coupled to the first plane PL1. The second page buffer PB2 may be coupled to second bit lines BL2 which are coupled to the second plane PL2.

The first page buffer PB1 and the second page buffer PB2 included in the page buffer block 123 may operate by page buffer control signals PBS which are provided from the control logic 130. The page buffer control signals PBS may be signals which are associated with the buffer program signal and the buffer read signal described above.

The column decoder 124 may transfer data applied through column lines CL, to the page buffer block 123 through page lines PL in response to a column address ADDR_C.

The input/output circuit 125 may input/output data DATA in response to an input/output signal IOS provided from the control logic 130. For example, the input/output circuit 125 may transfer data DATA inputted from an exterior, to the column decoder 124 through the column lines CL, or output data DATA transferred through the column lines CL from the memory cell array 110, to the exterior, e.g., the host device.

The control logic 130 may control the peripheral circuit 120 in response to a program command CMD_P, a read command CMD_R and an address ADDR which are transferred from the processor 220.

As shown in FIG. 4, in the case where the memory cell array 110 of the nonvolatile memory device NVM comprises two planes that is, the first plane PL1 and the second plane PL2, data transfer training in accordance with an embodiment of the present invention may be performed for each plane.

For example, in the case of performing program data transfer training to the first plane PL1 of a training memory device, the memory control unit 230 may transfer normal program signals to not only non-training memory devices but also the second plane PL2 of the training memory device, and may perform the program data transfer training to the first plane PL1 of the training memory device while normal program operations are performed to the non-training memory devices and the second plane PL2 of the training memory device.

Also, in the case of performing read data transfer training to the first plane PL1 of a training memory device, the memory control unit 230 may store data by transferring normal program signals to non-training memory devices and the second plane PL2 of the training memory device and transferring a buffer program signal to the first plane PL1 of the training memory device. Thereafter, by transferring normal read signals to the non-training memory devices and the second plane PL2 of the training memory device, while normal read operations are performed to the non-training memory devices and the second plane PL2 of the training memory device, read data transfer training to the first plane PL1 of the training memory device may be performed.

In the present embodiment, for the sake of convenience in explanation, it will be described as an example that a nonvolatile memory device NVM comprises one plane.

Figure 5:
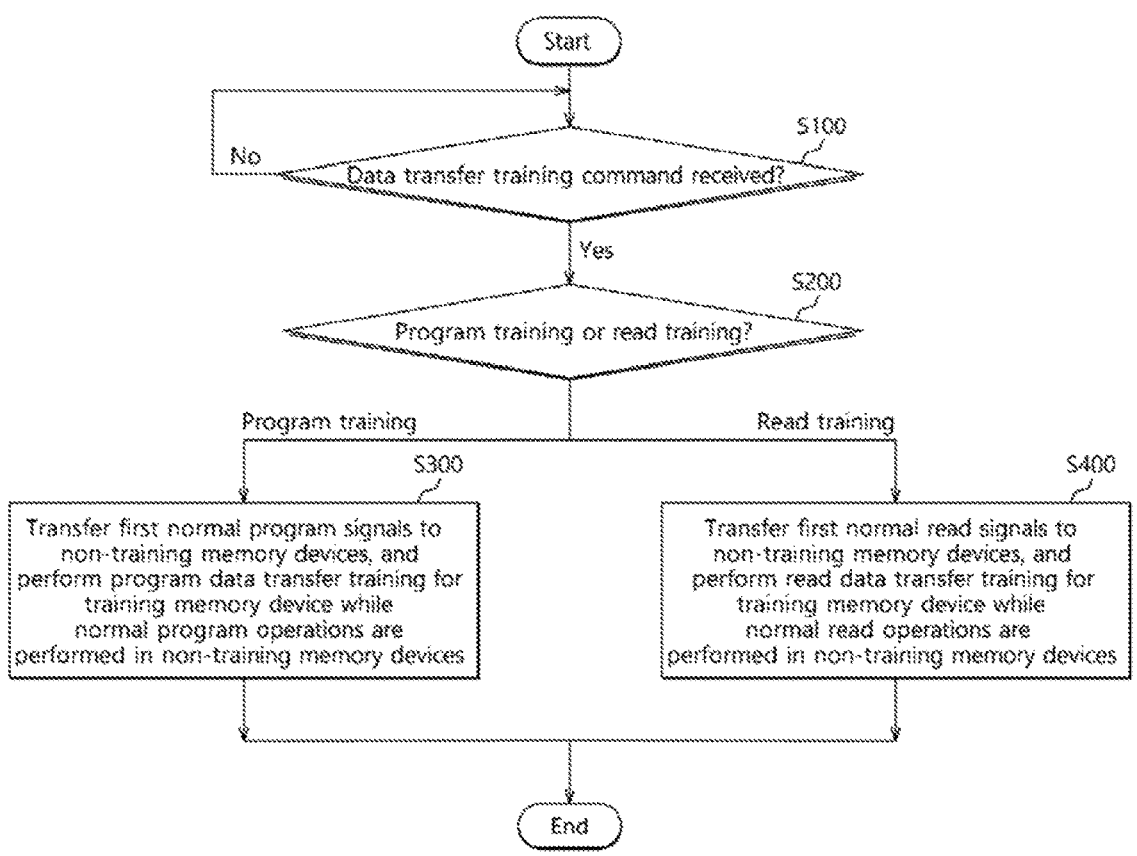
FIG. 5 is an exemplary flow chart of a data transfer training method in accordance with an embodiment.

FIG. 5 is an exemplary flow chart of a data transfer training method in accordance with an embodiment.

At step S100 the processor 220 of the controller 200 may determine whether a data transfer training command is received from the host device. If a data transfer training command is received from the host device, step S200 may be performed.

At the step S200, the processor 220 may determine whether the data transfer training command is a program data transfer training command or a read data transfer training command. The data transfer training command may include an information indicating the kind of the command, an information on a transfer timing. Accordingly, the processor 220 may determine whether the data transfer training command is a program data transfer training command or a read data transfer training command based on the corresponding kind information.

If the data transfer training command is a program data transfer training command, the processor 220 may then perform step S300. Meanwhile, if the data transfer training command is a read data transfer training command, the processor 220 may perform step S400.

At step S300, the controller 200 may first transfer normal program signals to non-training memory devices among the plurality of nonvolatile memory devices NVM included in the memory device 100, and may perform program data transfer training to a training memory device while normal program operations are performed to the non-training memory devices. A concrete method of program data transfer training to a training memory device will be described below in detail with reference to FIGS. 6 to 12.

At the step S400, the controller 200 may first transfer normal read signals to non-training memory devices among the plurality of nonvolatile memory devices NVM included in the memory device 100, and may perform read data transfer training to a training memory device while normal read operations are performed to the non-training memory devices. A concrete method of read data transfer training for a training memory device will be described later in detail with reference to FIGS. 13 to 19.

Figure 6:
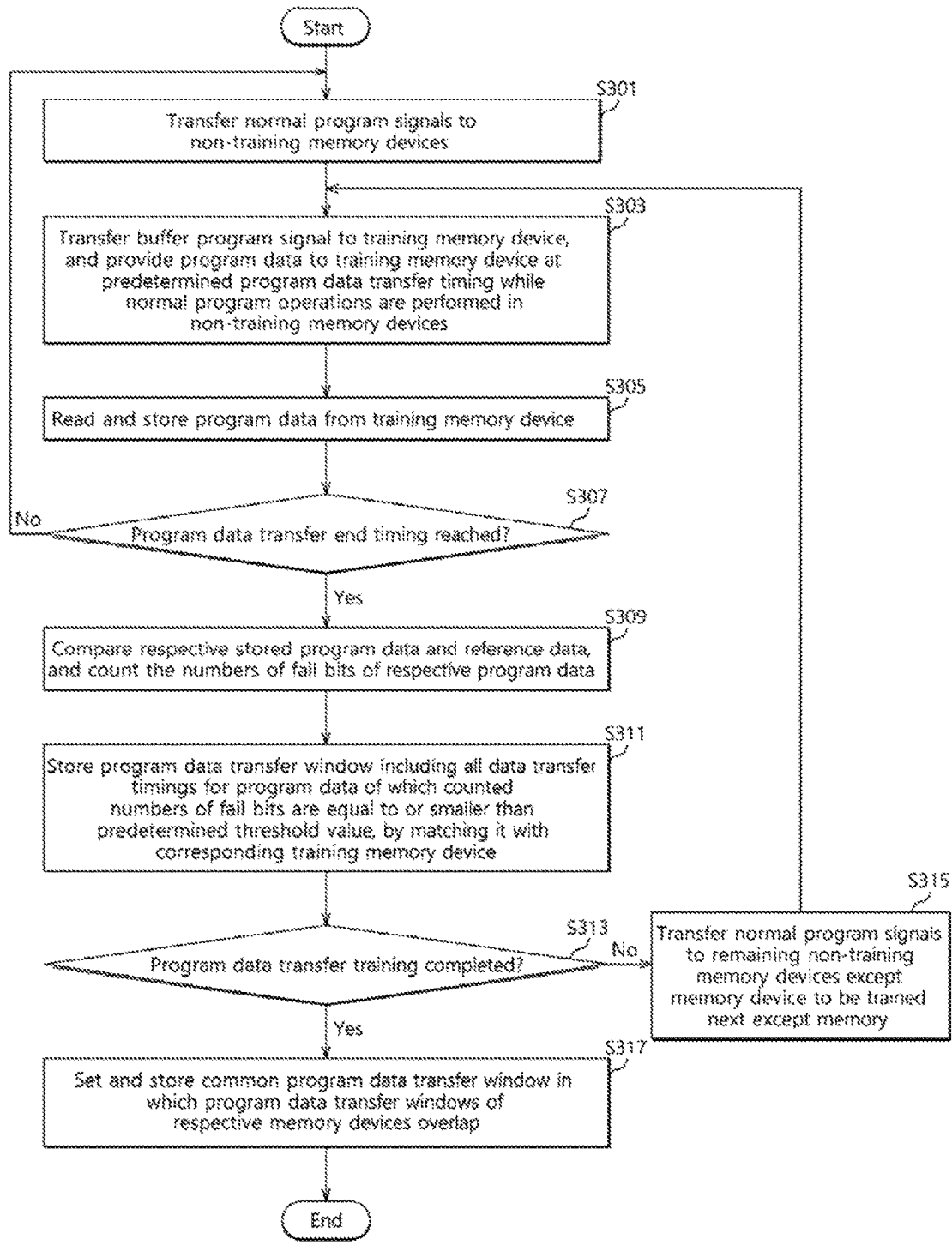
FIG. 6 is an exemplary flow chart of program data transfer training method shown in FIG. 5.
Figure 7:
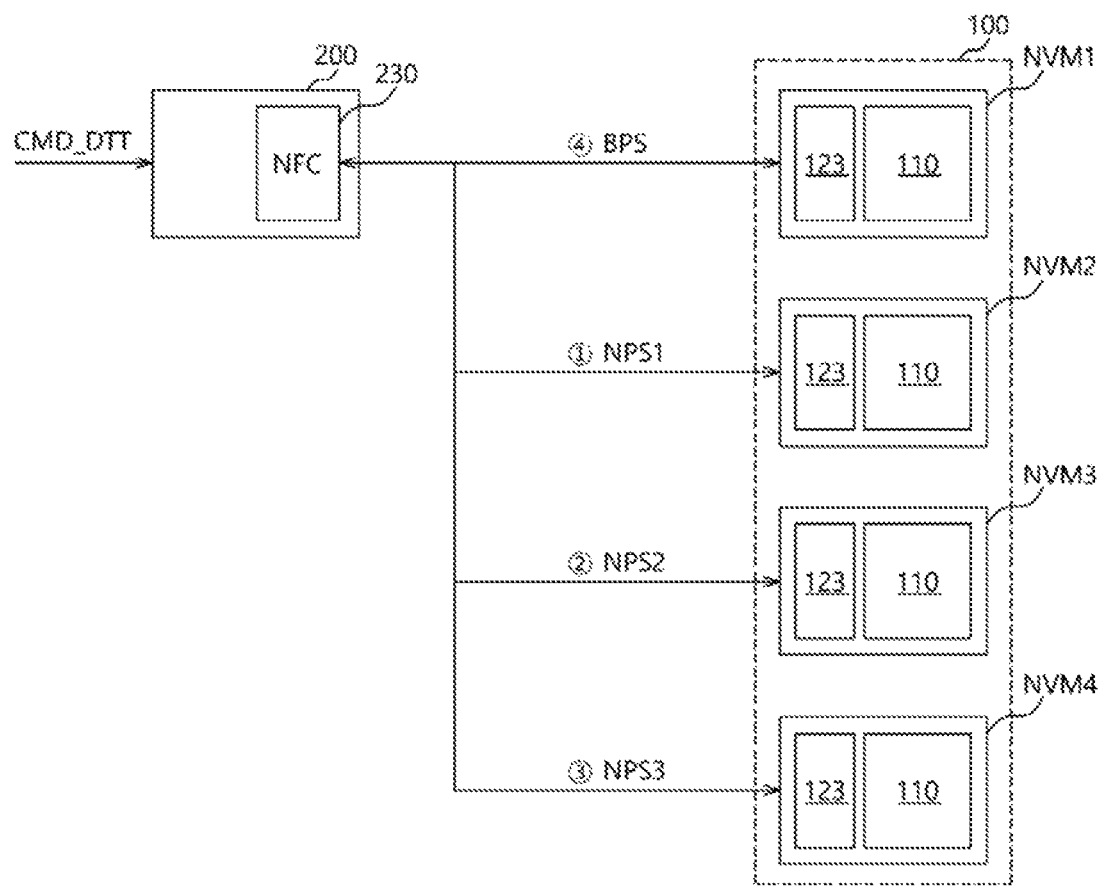
FIG. 7 is an exemplary diagram illustrating program signals which are provided to memory devices from a controller in a program data transfer training operation.

FIG. 6 is an exemplary flow chart providing a more detailed illustration of the program data transfer training method of FIG. 5. FIG. 7 is an exemplary diagram illustrating program signals which are provided to memory devices from the controller 200 in a program data transfer training operation.

Figure 8:
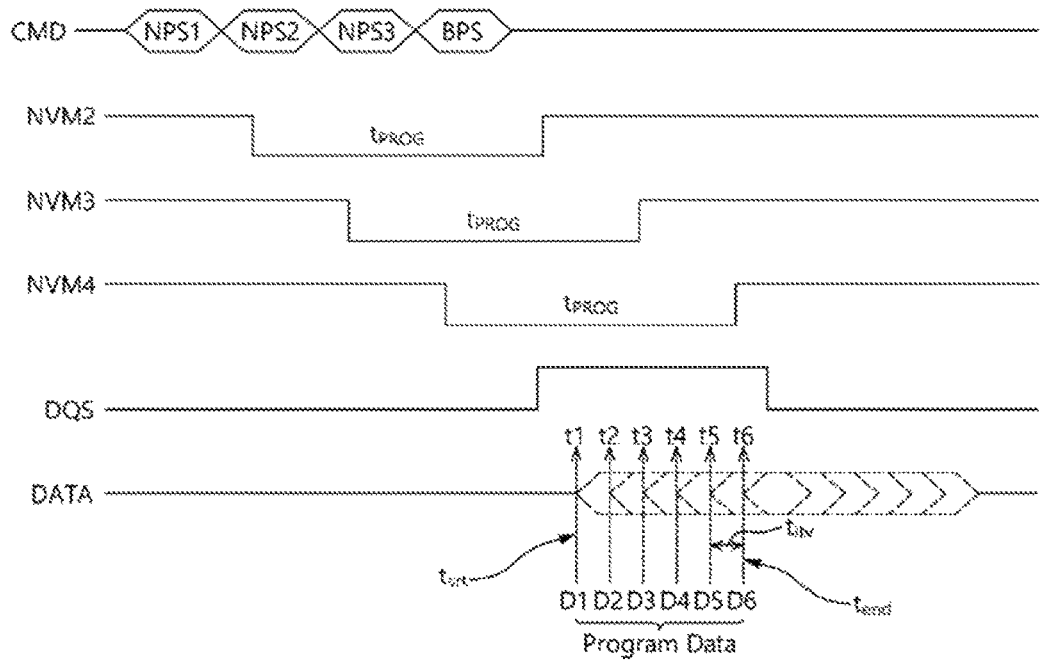
FIG. 8 is an exemplary timing diagram to assist in the detailed explanation of an example in which the program data transfer training operation is performed according to timings defined in the data transfer timing register.
Figure 9:
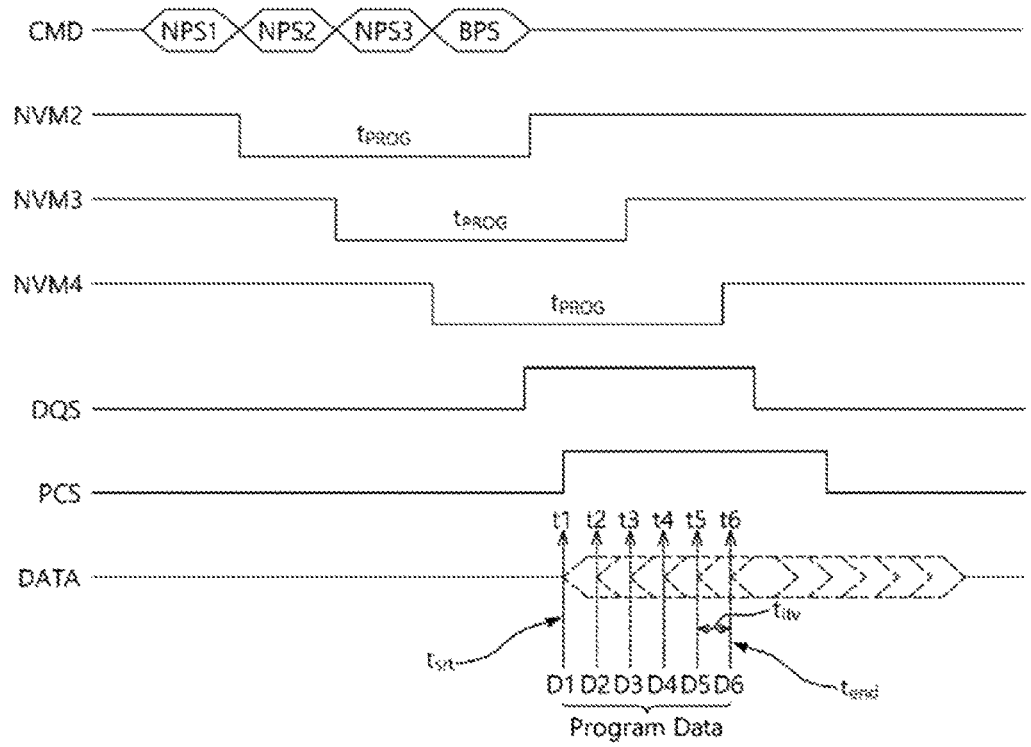
FIG. 9 is an exemplary timing diagram to assist in the detailed explanation of an example in which the program data transfer training operation is started when a peak current is generated.

FIG. 8 is an exemplary timing diagram to assist in the detailed explanation of an example in which the program data transfer training operation is performed according to timings defined in the data transfer timing register, and FIG. 9 is an exemplary timing diagram to assist in the detailed explanation of an example in which the program data transfer training operation is started when a peak current is generated.

Figure 10:
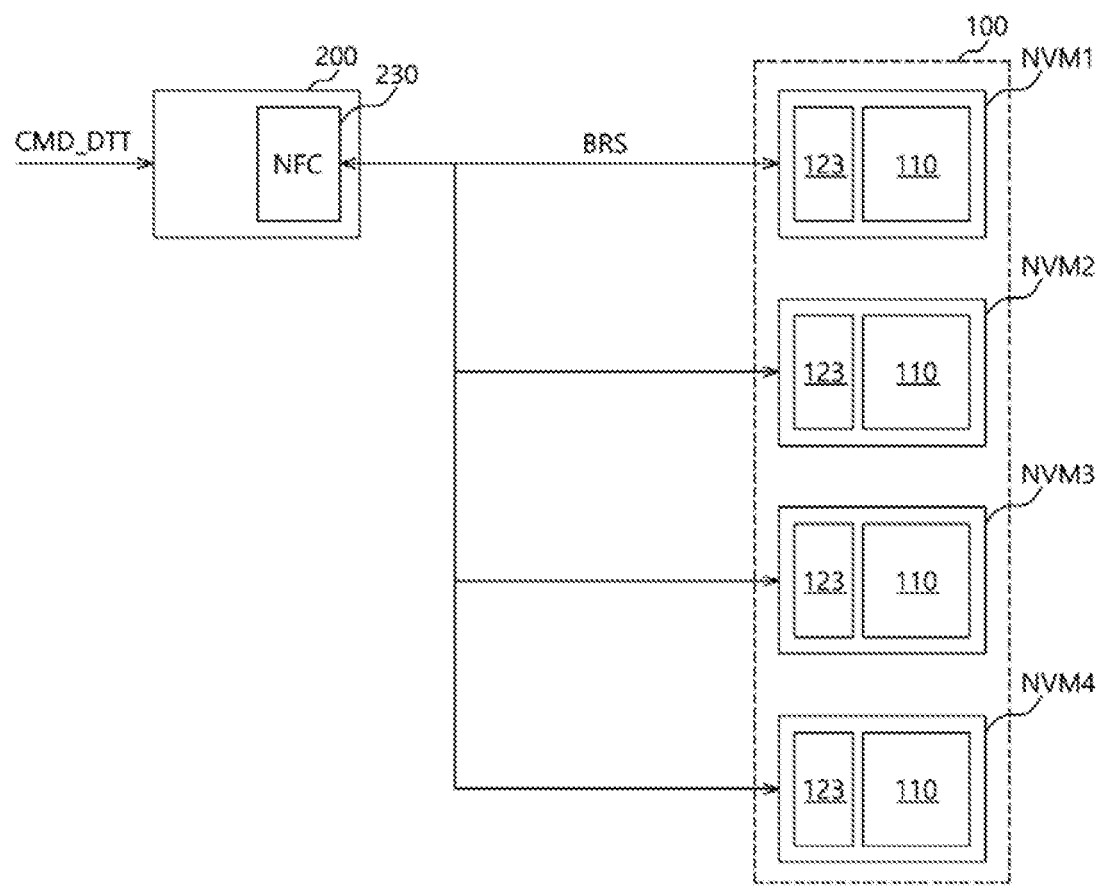
FIG. 10 is an exemplary diagram illustrating that a signal for reading the program data stored in the program data transfer training operation is provided to a memory device from the controller.
Figure 11:
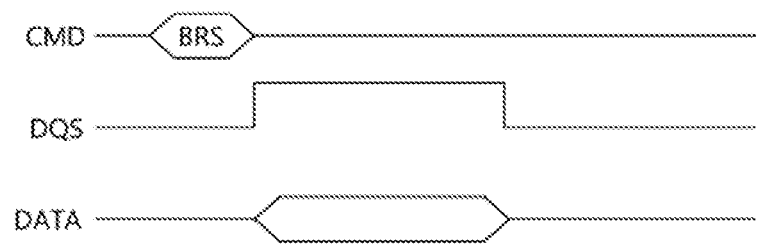
FIG. 11 is an exemplary timing diagram to assist in the explanation of an operation of reading the program data stored in a training memory device.
Figure 12:
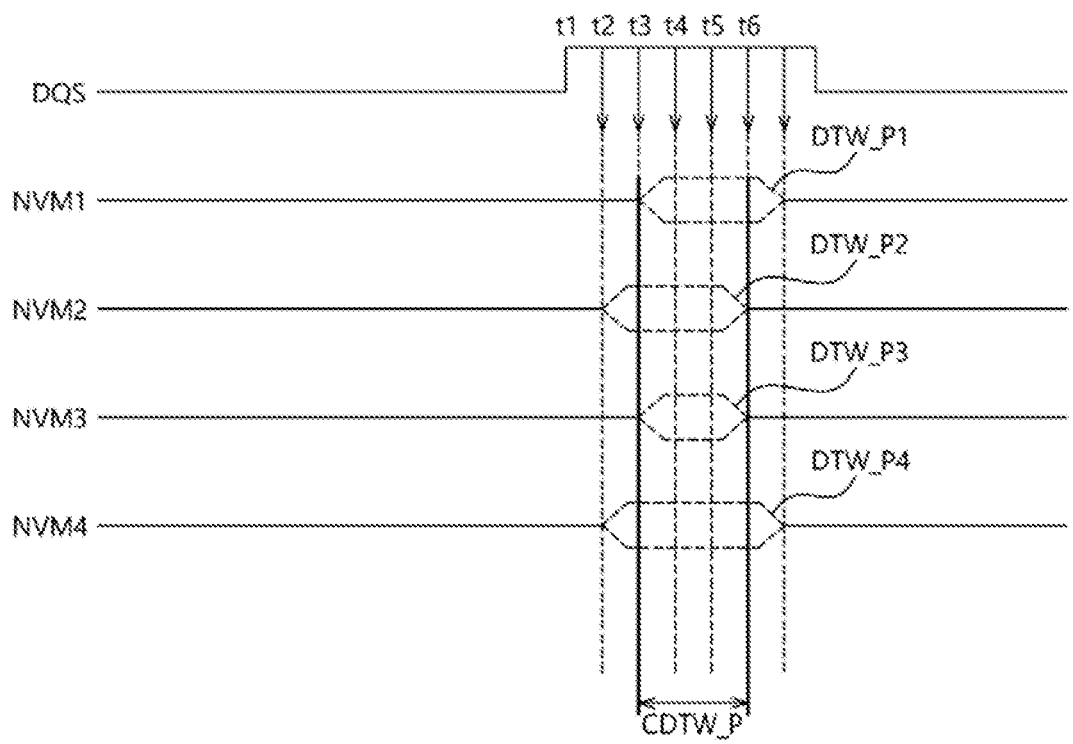
FIG. 12 is an exemplary diagram to assist in the explanation of setting a common program data transfer window for the plurality of memory devices.

FIG. 10 is an exemplary diagram illustrating that a signal for reading the program data stored in the program data transfer training operation is provided to a memory device from the controller 200 FIG. 11 is an exemplary timing diagram to assist in the explanation of an operation of reading the program data stored in a training memory device, and FIG. 12 is an exemplary diagram to assist in the explanation of setting a common program data transfer window for the plurality of memory devices.

In explaining the program data transfer training method with reference to FIG. 6, reference will be made to FIGS. 7 to 12. Also, for the sake of convenience in explanation, it is assumed that, in FIG. 6, the memory device 100 includes first to fourth nonvolatile memory devices NVM1 to NVM4. Moreover, among the first to fourth nonvolatile memory devices NVM1 to NVM4, the first nonvolatile memory device NVM1 is assumed as a training memory device, and the remaining second to fourth nonvolatile memory devices NVM2 to NVM4 are assumed as non-training memory devices. Program data transfer training to be described below with reference to FIG. 6 may be performed sequentially from the first nonvolatile memory device NVM1 to the fourth nonvolatile memory device NVM4, but is not specifically limited thereto.

At step S301, the memory control unit 230 may transfer normal program signals NPS1 to NPS3 to the non-training memory devices NVM2 to NVM4. While it is illustrated in FIG. 7 that normal program signals are transferred sequentially from the second nonvolatile memory device NVM2 to the fourth nonvolatile memory device NVM4, a transfer sequence of normal program signals for the non-training memory devices NVM2 to NVM4 is not specifically limited thereto.

At step S303, the memory control unit 230 may transfer a buffer program signal BPS to the training memory device NVM1. That is to say, the memory control unit 230 may transfer the buffer program signal BPS to the training memory device NVM1 after transfer of the normal program signals NPS1 to NPS3 to the non-training memory devices NVM2 to NVM4 is completed.

Also, while normal program operations are performed to the non-training memory devices NVM2 to NVM4 which have received the normal program signals NPS1 to NPS3 at the step S301, the memory control unit 230 may start providing program data to the training memory device NVM1 according to the timings of a timing set TS selected in the data transfer timing register DTTR.

In this regard the memory control unit 230 may generate and output a data strobe signal DQS, and may start providing program data in synchronization with the data strobe signal DQS.

For example, as shown in FIG. 8 the memory control unit 230 may start providing program data to the training memory device NVM1 in conformity with a transfer start timing $t_{srt}$ that is set as a point of time delayed by a predetermined time from a point of time at which the data strobe signal DQS transitions from a logic low to a logic high. The program data provided in this way may be stored in the page buffer 123 of the training memory device NVM1. For the sake of convenience in explanation, the program data provided to the training memory device NVM1 from the memory control unit 230 at the transfer start timing $t_{srt}$ is referred to as first data D1 (see FIG. 8).

In the meantime, as shown in FIG. 9, the memory control unit 230 may not provide program data to the training memory device NVM1 until a state information indicating generation of a peak current is received from at least one non-training memory device among the non-training memory devices NVM2 to NVM4. In other words, the memory control unit 230 may not provide program data to the training memory device NVM1 until a peak current signal PCS obtains logic high from a logic low from a point of time at which the data strobe signal DQS transitions from a logic low to a logic high. If the peak current signal PCS transitions from a logic low to a logic high, at a timing of which is a transfer start timing $t_{srt}$, the memory control unit 230 may start providing program data from the transfer start timing $t_{srt}$.

At step S305, the memory control unit 230 may read the first data D1 from the page buffer 123 of the training memory device NVM1 and store the read first data D1 in an optional region of the random access memory 240 by matching it with a corresponding transfer timing.

For example, as shown in FIG. 10, the memory control unit 230 may transfer a buffer read signal BRS to the training memory device NVM1. As shown in FIG. 11, the training memory device NVM1 having received the buffer read signal BRS may transfer the first data D1 to the memory control unit 230 in synchronization with the data strobe signal DQS.

At step S307, the memory control unit 230 may determine whether or not a current timing at which program data is provided to the training memory device NVM1 is a transfer end timing $t_{end}$. If it is determined that the current timing is the transfer end timing $t_{end}$, the memory control unit 230 may perform step S309. If it is determined that the current timing is not the transfer end timing $t_{end}$, the memory control unit 230 may return to the step S301 and perform program data transfer training for a next timing.

As shown in FIG. 8, a data transfer timing set TS for program data transfer training may include a transfer start timing $t_{srt}$, a transfer end timing $t_{end}$ and a plurality of timings with a predetermined transfer interval $t_{itv}$ between the transfer start timing $t_{srt}$ and the transfer end timing $t_{end}$.

According to this fact, the steps S301 to S307 may be repeated by the number of timings included in the timing set TS for one nonvolatile memory device NVM. For example, when assuming that the timing set TS includes six timings including the transfer start timing $t_{srt}$ and the transfer end timing $t_{end}$, the steps S301 to S307 may be repeated six times for one nonvolatile memory device NVM. FIGS. 8 and 9 illustrate that the steps S301 to S307 are repeated six times. Accordingly, first to sixth data D1 to D6 and transfer timings t1 to t6 respectively corresponding to the first to sixth data D1 to D6 may be stored in the random access memory 240 by being matched with each other.

At step S309, the data comparator 250 of the controller 200 may compare the respective first to sixth data D1 to D6 stored in the random access memory 240 with predetermined reference data, and may count the number of fail bits in each of the first to sixth data D1 to D6.

At step S311, the processor 220 of the controller 200 may compare the number of fail bits in each of the first to sixth data D1 to D6 counted by the data comparator 250 with a predetermined threshold value, may extract data of which the number of fail bits is equal to or smaller than the predetermined threshold value, among the first to sixth data D1 to D6, and may obtain a program data transfer window DTW_P (see FIG. 12) including all transfer timings corresponding to the extracted data. Moreover, the processor 220 may store the program data transfer window DTW_P and an information (for example an identification information and so forth) on a corresponding training memory device (for example NVM1) in an optional region of the random access memory 240 by matching them with each other.

At step S313, the processor 220 may determine whether program data transfer training to all the nonvolatile memory devices NVM1 to NVM4 is completed or not. If it is determined that program data transfer training to all the nonvolatile memory devices NVM1 to NVM4 is completed, the processor 220 may perform step S317. If it is determined that program data transfer training to all the nonvolatile memory devices NVM1 to NVM4 is not completed, the processor 220 may perform step S315.

At the step S315, the processor 220 may transfer normal program signals to remaining non-training memory devices NVM1, NVM3 and NVM4 except a training memory device of a next turn (for example, the second memory device NVM2). Thereafter, the processor 220 may perform the step S303.

At the step S317, the processor 220 may extract an overlapping period of program data transfer windows stored in the random access memory 240 and respectively corresponding to nonvolatile memory devices, and may set the extracted overlapping period as a common program data transfer window for the memory device 100. The processor 220 may store the set common program data transfer window in the system data region of an optional nonvolatile memory device NVM in the memory device 100 such that the common program data transfer window may be applied thereafter in an actual operation of the data storage device 10.

For example, referring to FIG. 12, if program data transfer training to the first to fourth nonvolatile memory devices NVM1 to NVM4 is completed, first to fourth program data transfer windows DTW_P1 to DTW_P4 respectively corresponding to the first to fourth nonvolatile memory devices NVM1 to NVM4 may be stored in the random access memory 240. The processor 220 may detect that the overlapping period of the first to fourth program data transfer windows DTW_P1 to DTW_P4 starts from a second timing t2 and ends at a fifth timing t5, and may set the period from the second timing t2 to the fifth timing t5 as a common program data transfer window CDTW_P that may be applied in common to the first to fourth memory devices NVM1 to NVM4.

The processor 220 may store the set common program data transfer window CDTW_P in at least one nonvolatile memory device among the first to fourth nonvolatile memory devices NVM1 to NVM4. If the data storage device 10 is powered on, the processor 220 may read the common program data transfer window CDTW_P from a corresponding nonvolatile memory device and load it in the random access memory 240, and, when a program request is received from the host device, may control the memory control unit 230 to transfer data to the memory device 100 according to the loaded common program data transfer window CDTW_P.

Figure 13:
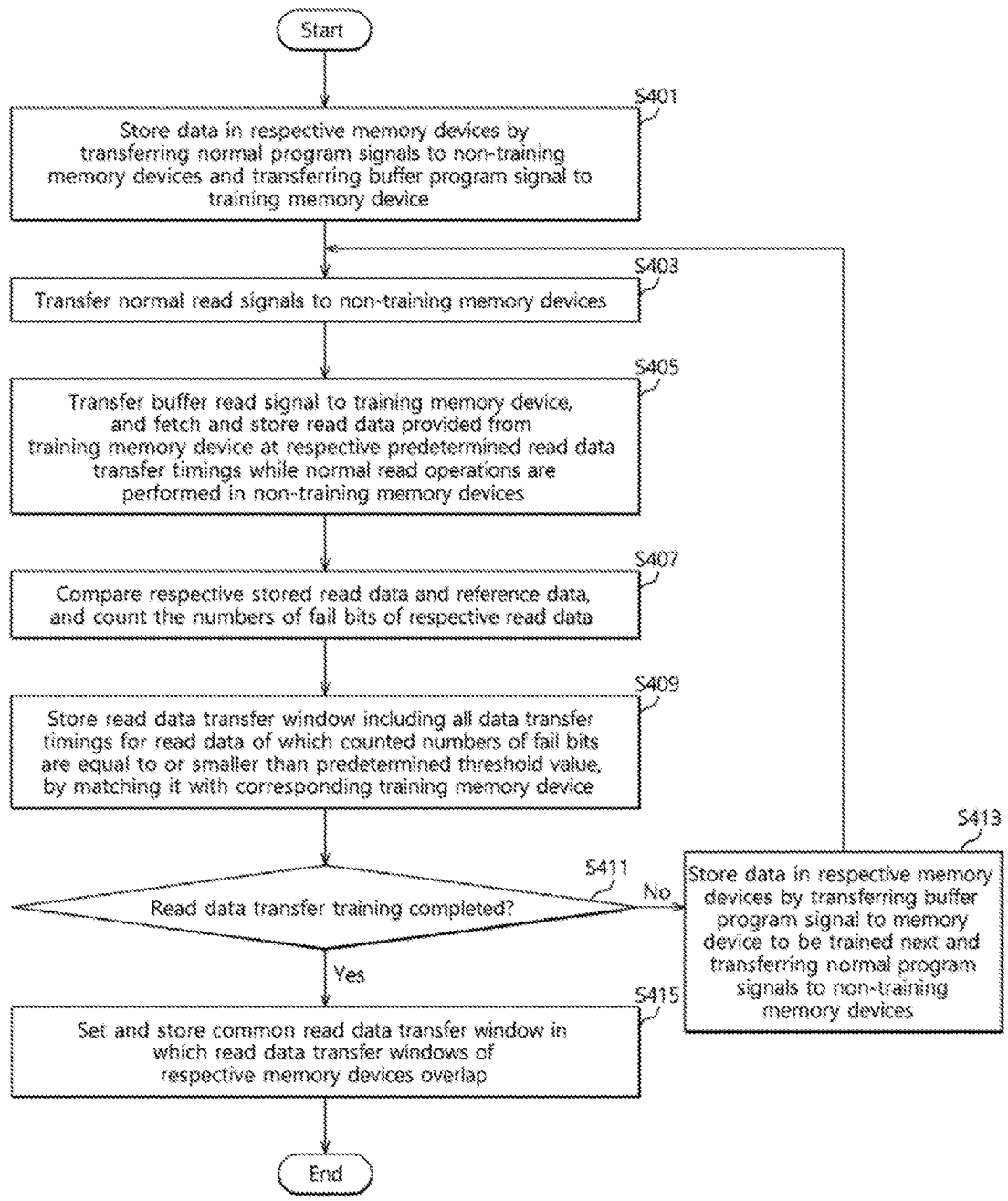
FIG. 13 is an exemplary flow chart of read data transfer training method shown in FIG. 5.
Figure 14:
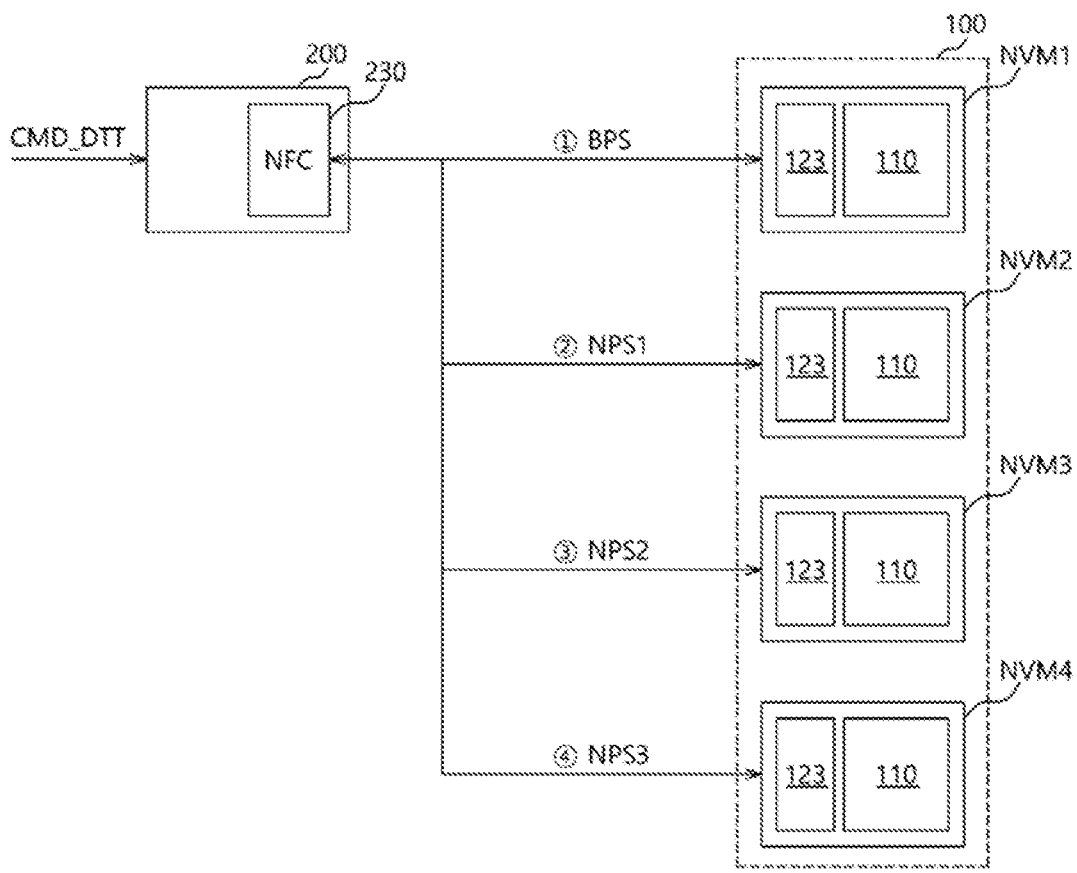
FIG. 14 is an exemplary diagram illustrating program signals which are provided to the memory devices from the controller in a read data transfer training operation.
Figure 15:
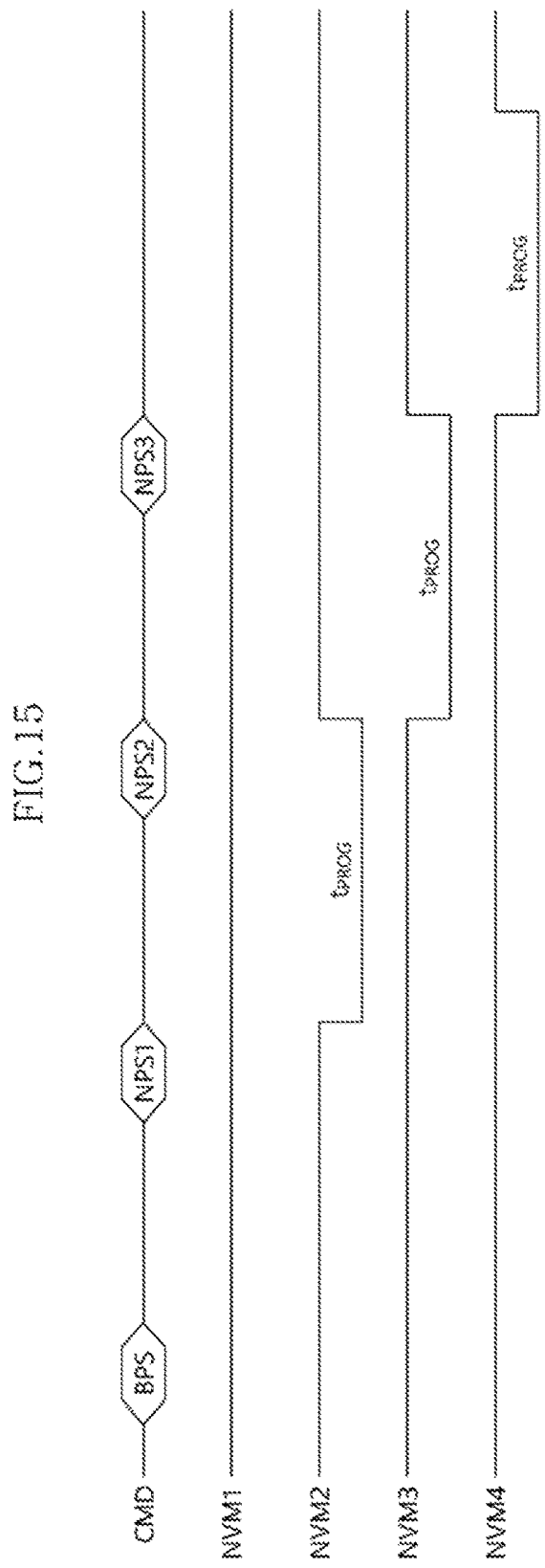
FIG. 15 is an exemplary timing diagram to assist in the explanation of performing program operations in the memory devices.

FIG. 13 is an exemplary flow chart of read data transfer training method of FIG. 5, FIG. 14 is an exemplary diagram illustrating program signals which are provided to the memory devices from the controller in a read data transfer training operation, and FIG. 15 is an exemplary timing diagram to assist in the explanation of performing program operations in the memory devices.

Figure 16:
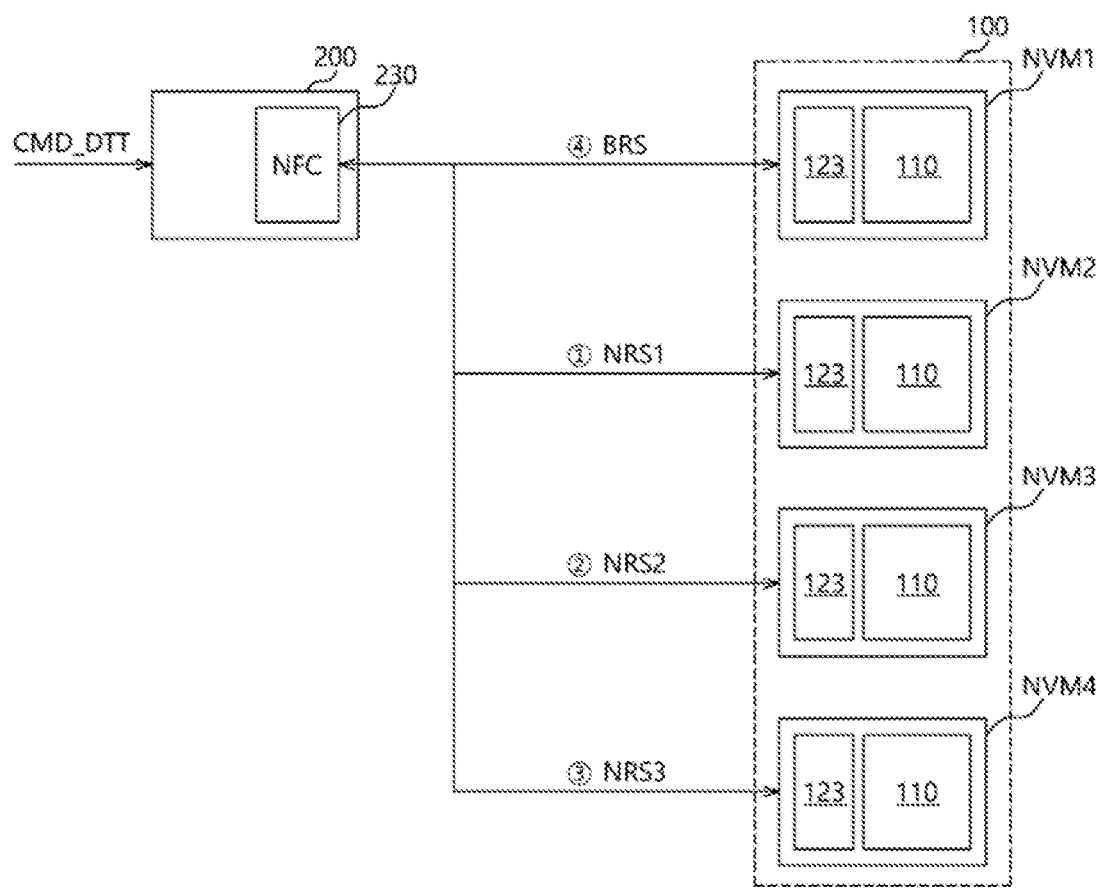
FIG. 16 is an exemplary diagram illustrating that read signals are provided to the memory devices from the controller in the read data transfer training operation.
Figure 17:
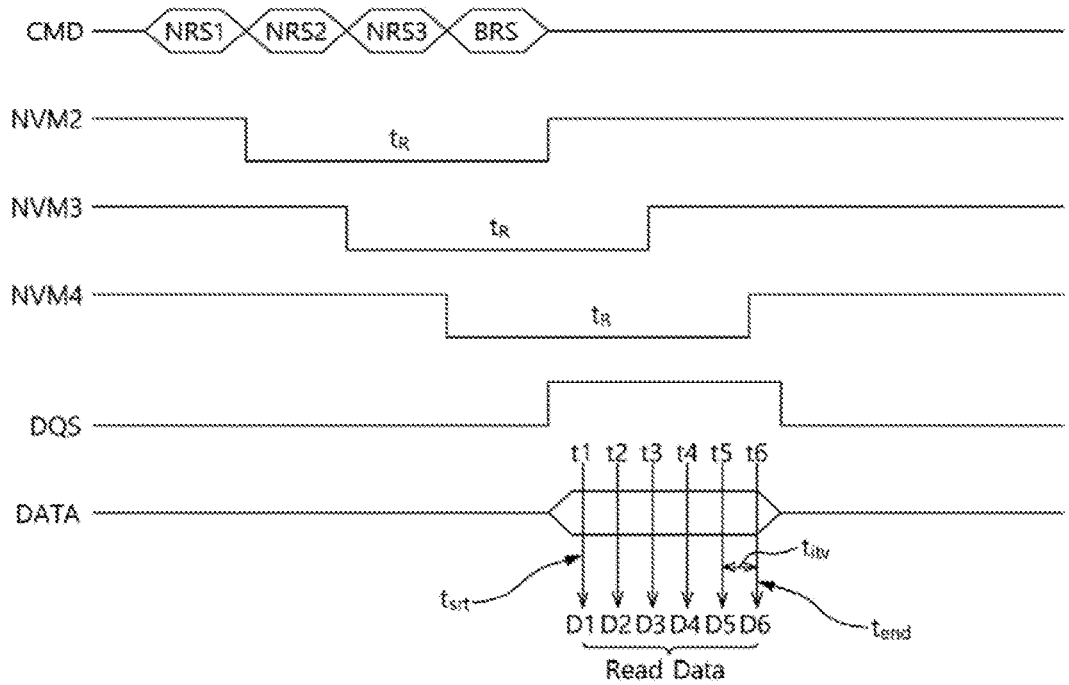
FIG. 17 is an exemplary timing diagram to assist in the detailed explanation of an example in which the read data transfer training operation is performed according to timings defined in the data transfer timing register.
Figure 18:
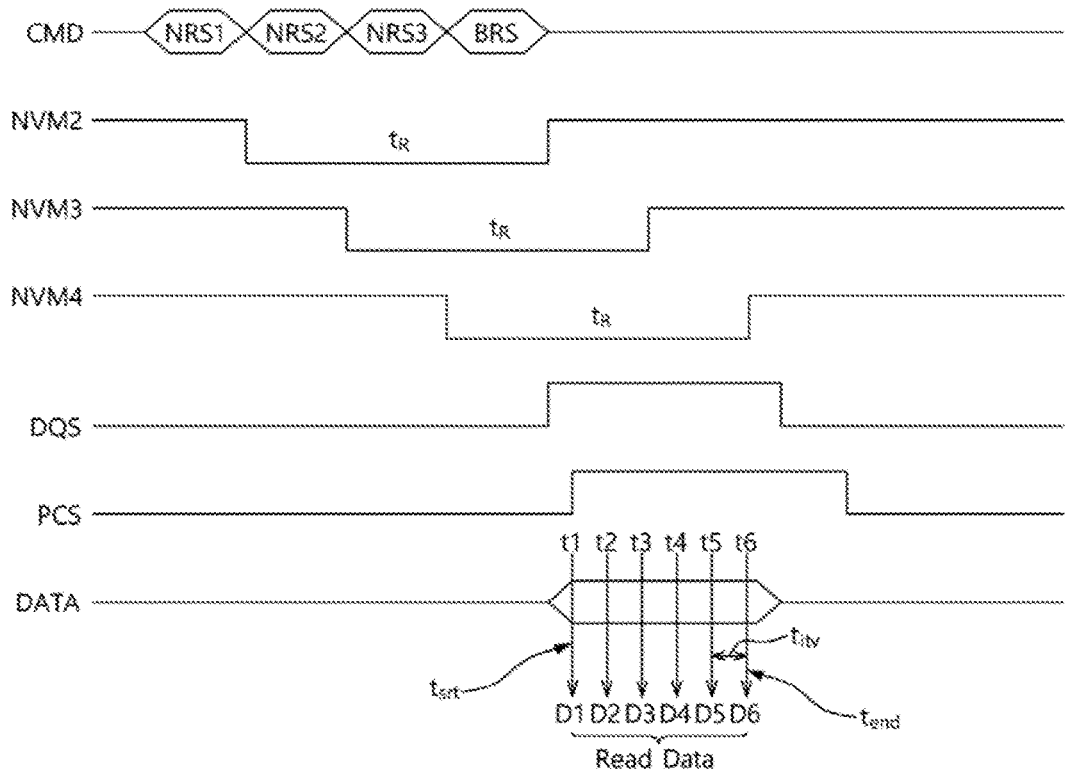
FIG. 18 is an exemplary timing diagram to assist in the detailed explanation of an example in which the read data transfer training operation is started when a peak current is generated.
Figure 19:
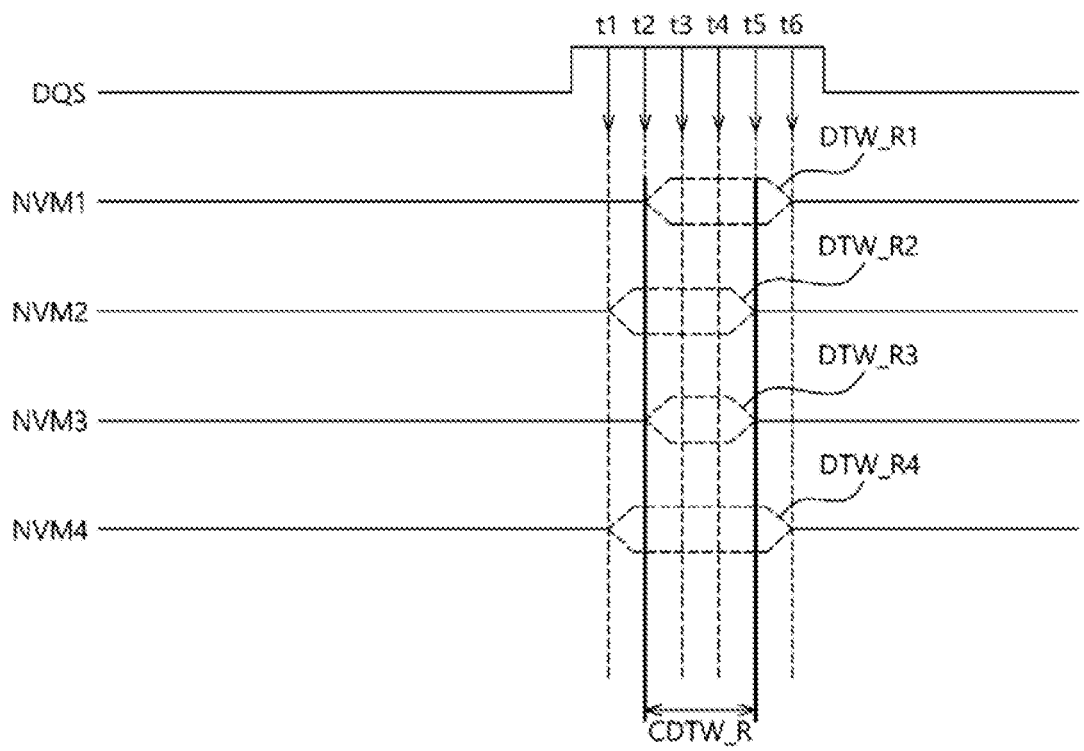
FIG. 19 is an exemplary diagram to assist in the explanation of setting a common read data transfer window for the plurality of memory devices.

FIG. 16 is an exemplary diagram illustrating that read signals are provided to the memory devices from the controller in the read data transfer training operation, FIG. 17 is an exemplary timing diagram to assist in the detailed explanation of an example in which the read data transfer training operation is performed according to timings defined in the data transfer timing register, and FIG. 18 is an exemplary timing diagram to assist in the detailed explanation of an example in which the read data transfer training operation is started when a peak current is generated. FIG. 19 is an exemplary diagram to assist in the explanation of setting a common read data transfer window for the plurality of memory devices.

In explaining the read data transfer training method with reference to FIG. 13, reference will be made to FIGS. 14 to 19. Also, for the sake of convenience in explanation, it is assumed that, in FIG. 13, the memory device 100 includes first to fourth nonvolatile memory devices NVM1 to NVM4. Moreover, among the first to fourth nonvolatile memory devices NVM1 to NVM4, the first nonvolatile memory device NVM1 is assumed as a training memory device, and the remaining second to fourth nonvolatile memory devices NVM2 to NVM4 are assumed as non-training memory devices. Read data transfer training to be described below with reference to FIG. 13 may be performed sequentially from the first nonvolatile memory device NVM1 to the fourth nonvolatile memory device NVM4, but is not specifically limited thereto.

At step S401, the memory control unit 230 may transfer normal program signals NPS1 to NPS3 and a buffer program signal BPS to the non-training memory devices NVM2 to NVM4 and the training memory device NVM1, respectively. While it is illustrated in FIG. 14 that program signals are transferred in a sequence from the first memory device NVM1 to the fourth memory device NVM4, a transfer sequence of program signals is not specifically limited thereto.

As the buffer program signal BPS is transferred to the training memory device NVM1 and the normal program signals NPS1 to NPS3 are transferred to the non-training memory devices NVM2 to NVM4, as shown in FIG. 15, a cell program operation may not be performed to the training memory device NVM1, and cell program operations may be performed to the non-training memory devices NVM2 to NVM4 in the sequence in which the normal program signals NPS1 to NPS3 are received therein.

At step S403, the memory control unit 230 may transfer normal read signals NRS1 to NRS3 to the non-training memory devices NVM2 to NVM4. While it is illustrated in FIG. 6 that normal read signals are transferred in a sequence from the second memory device NVM2 to the fourth memory device NVM4, a transfer sequence of normal read signals is not specifically limited thereto.

At step S405, the memory control unit 230 may transfer a buffer read signal BRS to the training memory device NVM1. The training memory device NVM1 which has received the buffer read signal BRS may provide read data to the memory control unit 230.

Also, while normal read operations are performed to the non-training memory devices NVM2 to NVM4 which have received the normal read signals NRS1 to NRS3 at the step S403, the memory control unit 230 may fetch data read from the training memory device NVM1 in conformity with the timings of a timing set TS selected in the data transfer timing register DTTR.

In this regard, the memory control unit 230 may generate and output a data strobe signal DQS, and may start fetching data read from the training memory device NVM1 in synchronization with the data strobe signal DQS. The memory control unit 230 may repeatedly perform fetching data read from the training memory device NVM1 by the number of timings included in the timing set TS.

For example, when assuming that the timing set TS includes six timings including a transfer start timing $t_{srt}$ and a transfer end timing $t_{end}$, read data fetch may be performed six times for the training memory device NVM1 while the non-training memory devices NVM2 to NVM4 perform cell read operations one time. In FIGS. 17 and 18, it is illustrated that the fetching of data read from the training memory device NVM1 is performed six times. The memory control unit 230 may store fetched first to sixth data D1 to D6, in the random access memory 240, by matching them with respectively corresponding transfer timings.

In the meantime, as shown in FIG. 18, the memory control unit 230 may not fetch data read from the training memory device NVM1 until a state information indicating generation of a peak current is received from at least one non-training memory device among the non-training memory devices NVM2 to NVM4, even though the data strobe signal DQS transitions to a logic high. Afterwards, if a peak current signal PCS transitions from a logic low to a logic high, at a timing of which is a transfer start timing $t_{srt}$, the memory control unit 230 may start fetching data read from the training memory device NVM1 from the transfer start timing $t_{srt}$.

At step S407, the data comparator 250 of the controller 200 may compare the respective first to sixth data D1 to D6 stored in the random access memory 240 with predetermined reference data, and may count the number of fail bits in each of the first to sixth data D1 to D6.

At step S409, the processor 220 of the controller 200 may compare the number of fail bits in each of the first to sixth data D1 to D6 counted by the data comparator 250 with a predetermined threshold value, may extract data of which the number of fail bits is equal to or smaller than the predetermined threshold value, among the first to sixth data D1 to D6, and may obtain a read data transfer window DTW_R (see FIG. 19) including all transfer timings corresponding to the extracted data. Moreover, the processor 220 may store the read data transfer window DTW_R and an information (for example, an identification information) on a corresponding training memory device (for example, NVM1) in an optional region of the random access memory 240 by matching them with each other.

At step S411, the processor 220 may determine whether read data transfer training to all the nonvolatile memory devices NVM1 to NVM4 included in the memory device 100 is completed or not. If it is determined that read data transfer training to all the nonvolatile memory devices NVM1 to NVM4 included in the memory device 100 is completed, the processor 220 may perform step S415. If it is determined that read data transfer training to all the nonvolatile memory devices NVM1 to NVM4 included in the memory device 100 is not completed, the processor 220 may perform step S413.

At the step S413, the processor 220 may transfer a buffer program signal and normal program signals to a training memory device of a next turn (for example the second memory device NVM2) and the remaining non-training memory devices NVM1, NVM3 and NVM4, respectively. Thereafter, the processor 220 may perform the step S403.

At the step S415, the processor 220 may extract an overlapping period of read data transfer windows stored in the random access memory 240 and respectively corresponding to nonvolatile memory devices, and may set the extracted overlapping period as a common read data transfer window for the memory device 100. The processor 220 may store the set common read data transfer window in the system data region of an optional nonvolatile memory device NVM in the memory device 100 such that the common read data transfer window may be applied thereafter in an actual operation of the data storage device 10.

For example, referring to FIG. 19, if read data transfer training to the respective first to fourth nonvolatile memory devices NVM1 to NVM4 is completed, first to fourth read data transfer windows DTW_R1 to DTW_R4 respectively corresponding to the first to fourth memory devices NVM1 to NVM4 may be stored in the random access memory 240. The processor 220 may detect that the overlapping period of the first to fourth read data transfer windows DTW_R1 to DTW_R4 starts from a second timing t2 and ends at a fifth timing t5, and may set the period from the second timing t2 to the fifth timing t5 as a common read data transfer window CDTW_R that may be applied in common to the first to fourth memory devices NVM1 to NVM4.

The processor 220 may store the set common read data transfer window CDTW_R in at least one nonvolatile memory device among the first to fourth nonvolatile memory devices NVM1 to NVM4. If the data storage device 10 is powered on, the processor 220 may read the common read data transfer window CDTW_R from a corresponding nonvolatile memory device and load it in the random access memory 240, and, when a read request is received from the host device, may control the memory control unit 230 to fetch data read from the memory device 100 according to the loaded common read data transfer window CDTW_R.

While the present invention has been described in reference to various specific embodiments, it will be understood to those skilled in the art that the described embodiments are examples only. Accordingly, the data transfer training method and the data storage device performing the same described herein should not be limited based on the described embodiments. Many other embodiments may be envisioned by those skilled in the relevant art without departing from the scope of the invention as defined in the appended claims.

What is claimed is:

1. A data transfer training method of a data storage device including a plurality of memory devices and a controller, the method comprising:

determining whether a program data transfer training command or a read data transfer training command is received from a host device;

transferring normal program signals to non-training memory devices among the plurality of memory devices, and concurrently performing a program data transfer training to a training memory device among the plurality of memory devices by providing program data to a page buffer of the training memory device in conformity with a predetermined program data transfer timing while performing normal program operations to the non-training memory devices in response to a received program data transfer training command; and transferring normal read signals to the non-training memory devices, and concurrently performing a read data transfer training to the training memory device bar fetching and storing data read from the training memory device in conformity with a predetermined read data transfer timing while performing normal read operations to the non-training memory devices in response to a received read data transfer training command.

2. The data transfer training method according to claim 1, wherein the performing of the program data transfer training comprises:

transferring the normal program signals to the non-training memory devices;

reading the program data from the page buffer of the training memory device; and storing the read program data in match with a timing on which the program data were transferred to the page buffer of the training memory device.

3. The data transfer training method according to claim 2, wherein the predetermined program data transfer timing includes a transfer start timing, a transfer end timing and a plurality of transfer timings existing with a predetermined interval between the transfer start timing and the transfer end timing, and further comprising repeating the performing of the program data transfer training at the respective transfer timings from the transfer start timing to the transfer end timing.

4. The data transfer training method according to claim 3, further comprising:

comparing the read program data for the respective transfer timings with predetermined reference data, and counting a number of fail bits in each of the read program data;

extracting the read program data in each case where the number of fail bits is equal to or less than a predetermined threshold value, among the read program data for the respective transfer timings; and storing a program data transfer window including all program data transfer timings respectively corresponding to the extracted read program data, in match with a corresponding training memory device.

5. The data transfer training method according to claim 4, further comprising:

determining whether the program data transfer training for the plurality of memory devices is completed; and extracting an overlapping period of the program data transfer windows for the respective memory devices and setting the extracted overlapping period as a common program data transfer window for the plurality of memory devices when the program data transfer training for the plurality of memory devices is completed.

6. The data transfer training method according to claim 1, wherein the program data is provided to the page buffer when a state information indicating generation of a peak current is received from at least one non-training memory device among the non-training memory devices.

7. The data transfer training method according to claim 1, wherein the performing of the read data transfer training comprises:
transferring normal program signals and a buffer program signal to the non-training memory devices and the training memory device, respectively;
transferring the normal read signals to the non-training memory devices; and
transferring a buffer read signal to the training memory device.

8. The data transfer training method according to claim 7, wherein the predetermined read data transfer timing includes a transfer start timing, a transfer end timing and a plurality of transfer timings existing with a predetermined interval between the transfer start timing and the transfer end timing, and
further comprising repeating the fetching and storing of the read data at the respective transfer timings from the transfer start timing to the transfer end timing during a single round of the normal read operations to the non-training memory devices.

9. The data transfer training method according to claim 8, further comprising:
comparing the fetched and stored read data for the respective transfer timings with predetermined reference data, and counting a number of fail bits in each of the fetched and stored read data;
extracting the fetched and stored read data in each case where the number of fail bits is equal to or less than a predetermined threshold value, among the fetched and stored read data for the respective transfer timings; and
storing a read data transfer window including all read data transfer timings respectively corresponding to the extracted read data, in match with a corresponding training memory device.

10. The data transfer training method according to claim 9, further comprising:
determining whether the read data transfer training for the plurality of memory devices is completed; and
extracting an overlapping period of the read data transfer windows for the respective memory devices and setting the extracted overlapping period as a common read data transfer window for the plurality of memory devices when the read data transfer training for the plurality of memory devices is completed.

11. The data transfer training method according to claim 1, wherein the data is fetched and stored when a state information indicating generation of a peak current is received from at least one non-training memory device among the non-training memory devices.

12. A data storage device comprising:
a plurality of memory devices; and
a controller configured to:
concurrently perform a program data transfer training to a training memory device among the memory devices by providing program data to a page buffer of the training memory device in conformity with a predetermined program data transfer timing while performing normal program operations to non-training memory devices among the memory devices in response to a program data transfer training command provided from a host device; and
concurrently perform a read data transfer training to the training memory device among the memory devices by fetching and storing data read from the training memory device in conformity with a predetermined read data transfer timing while performing normal read operations to the non-training memory devices in response to a read data transfer training command provided from the host device.

13. The data storage device according to claim 12, wherein the controller performs the program data transfer training by:
transferring normal program signals to the non-training memory devices;
reading the program data from the page buffer; and
storing the read program data in match with a timing of the providing of the program data to the page buffer.

14. The data storage device according to claim 13, wherein the predetermined program data transfer timing includes a transfer start timing, a transfer end timing and a plurality of transfer timings existing with a predetermined interval between the transfer start timing and the transfer end timing, and
wherein the controller is further configured to repeat the performing of the program data transfer training at the respective transfer timings from the transfer start timing to the transfer end timing.

15. The data storage device according to claim 14, the controller is further configured to:
compare the read program data for the respective transfer timings with predetermined reference data;
count a number of fail bits in each of the read program data;
extract the read program data in each case where the number of fail bits is equal to or less than a predetermined threshold value, among the read program data for the respective transfer timings;
store a program data transfer window including all program data transfer timings respectively corresponding to the extracted read program data, in match with a corresponding training memory device,
extract an overlapping period of the program data transfer windows for the respective memory devices when the program data transfer training for the plurality of memory devices is completed; and
set the extracted overlapping period as a common program data transfer window for the plurality of memory devices.

16. The data storage device according to claim 12, wherein the controller provides the program data to the page buffer when a state information indicating generation of a peak current is received from at least one memory device among the plurality of memory devices.

17. The data storage device according to claim 12, wherein the controller performs the read data transfer training by:
transferring normal program signals and a buffer program signal to the non-training memory devices and the training memory device, respectively;
transferring normal read signals to the non-training memory devices; and
transferring a buffer read signal to the training memory device during the normal read operations to the non-training memory devices.

18. The data storage device according to claim 17, wherein the predetermined read data transfer timing includes a transfer start timing, a transfer end timing and a plurality of transfer timings existing with a predetermined interval between the transfer start timing and the transfer end timing, and wherein the controller is further configured to repeat the fetching and storing of the read data at the respective transfer timings from the transfer start timing to the transfer end timing during a single round of the normal read operations to the non-training memory devices.

19. The data storage device according to claim 18, the controller is further configured to:

compare the fetched and stored read data for the respective transfer timings with predetermined reference data;

count a number of fail bits in each of the fetched and stored read data;

extract the fetched and stored read data in each case where the number of fail bits is equal to or less than a predetermined threshold value, among the fetched and stored read data for the respective transfer timings;

store a read data transfer window including all read data transfer timings respectively corresponding to the extracted read data, in match with a corresponding training memory device, extract an overlapping period of the read data transfer windows for the respective memory devices when the read data transfer training for the plurality of memory devices is completed; and set the extracted overlapping period as a common read data transfer window for the plurality of memory devices.

20. The data storage device according to claim 12, wherein the controller fetches and stores the data when a state information indicating generation of a peak current is received from at least one memory device among the plurality of memory devices.

* * * * *